United States Patent
Caveney et al.

(10) Patent No.: US 9,210,833 B2
(45) Date of Patent: Dec. 8, 2015

(54) ADJUSTABLE VERTICAL EXHAUST DUCT

(75) Inventors: Jack E. Caveney, North Palm Beach, FL (US); Scott R. Hartman, Oak Forest, IL (US); Andrzej Nicewicz, Wilmette, IL (US); Max W. Hibner, Glenview, IL (US)

(73) Assignee: Panduit Corp., Tinley Park, IL (US)

( * ) Notice: Subject to any disclaimer, the term of this patent is extended or adjusted under 35 U.S.C. 154(b) by 1191 days.

(21) Appl. No.: 12/731,877

(22) Filed: Mar. 25, 2010

(65) Prior Publication Data

US 2010/0248610 A1 Sep. 30, 2010

Related U.S. Application Data

(60) Provisional application No. 61/186,933, filed on Jun. 15, 2009, provisional application No. 61/164,499, filed on Mar. 30, 2009.

(51) Int. Cl.
*H05K 7/20* (2006.01)

(52) U.S. Cl.
CPC .................................. *H05K 7/20745* (2013.01)

(58) Field of Classification Search
CPC ..................................................... H05K 7/20
USPC ......................................................... 454/184
See application file for complete search history.

(56) References Cited

U.S. PATENT DOCUMENTS

| | | |
|---|---|---|
| 831,429 A | 9/1906 | Harrington |
| 3,192,306 A | 6/1965 | Skonnord |
| 3,827,342 A | 8/1974 | Hughes |
| 3,842,561 A | 10/1974 | Wong |
| 3,930,641 A | 1/1976 | Overmyer et al. |
| 4,347,782 A | 9/1982 | Hoecke |
| 4,357,860 A | 11/1982 | Krzak |
| 4,522,191 A | 6/1985 | Knowles et al. |
| 4,543,677 A | 10/1985 | Haglund et al. |
| 4,638,563 A | 1/1987 | Buniff |
| 4,865,013 A | 9/1989 | Teakell |
| 5,292,282 A | 3/1994 | Callas |
| 5,294,748 A | 3/1994 | Schwenk et al. |
| 5,511,842 A * | 4/1996 | Dillon ........................ 296/24.42 |
| 5,515,655 A | 5/1996 | Hoffmann |
| 5,653,631 A | 8/1997 | Andersen et al. |
| 5,671,805 A | 9/1997 | Ståhl et al. |

(Continued)

FOREIGN PATENT DOCUMENTS

| DE | 432098 | 8/1926 |
|---|---|---|
| DE | 2509487 A1 | 9/1976 |

(Continued)

OTHER PUBLICATIONS

Rack Technologies 2005 cabinet accessories catalog p. 6.1 and 6.7 (2 pages).

(Continued)

*Primary Examiner* — Steven B McAllister
*Assistant Examiner* — Samantha Miller
(74) *Attorney, Agent, or Firm* — Christopher S. Clancy; James H. Williams

(57) ABSTRACT

An adjustable exhaust duct includes a lower duct section and an upper duct section. The lower duct section may be larger or smaller than the upper duct section, and each duct has four identical locking systems. The locking systems secure the lower duct section and the upper duct section.

5 Claims, 35 Drawing Sheets

(56) References Cited

U.S. PATENT DOCUMENTS

| | | | |
|---|---|---|---|
| 5,791,980 A | 8/1998 | Kramer, Jr. |
| 5,873,556 A | 2/1999 | Reiker |
| 5,941,767 A | 8/1999 | Fukuda |
| 5,979,854 A | 11/1999 | Lundgren et al. |
| 5,995,368 A | 11/1999 | Lee et al. |
| 5,997,117 A | 12/1999 | Krietzman |
| 6,034,873 A | 3/2000 | Ståhl et al. |
| 6,185,098 B1 | 2/2001 | Benavides |
| 6,383,242 B1 | 5/2002 | Rogers et al. |
| 6,412,292 B2 | 7/2002 | Spinazzola et al. |
| 6,418,010 B1 | 7/2002 | Sawyer |
| 6,521,835 B1 | 2/2003 | Walsh |
| 6,554,697 B1 | 4/2003 | Koplin |
| 6,557,357 B2 | 5/2003 | Spinazzola et al. |
| 6,574,970 B2 | 6/2003 | Spinazzola et al. |
| 6,575,656 B2 | 6/2003 | Suh |
| 6,592,448 B1 | 7/2003 | Williams |
| 6,616,524 B2 | 9/2003 | Storck, Jr. et al. |
| 6,669,552 B1 | 12/2003 | Beer |
| 6,672,955 B2 | 1/2004 | Charron |
| 6,722,151 B2 | 4/2004 | Spinazzola et al. |
| 6,745,579 B2 | 6/2004 | Spinazzola et al. |
| 6,766,832 B2 | 7/2004 | DiMarco |
| 6,854,284 B2 | 2/2005 | Bash et al. |
| 6,867,967 B2 | 3/2005 | Mok |
| 6,949,050 B2 | 9/2005 | Takatori et al. |
| 7,137,772 B2 | 11/2006 | Blateri |
| 7,236,362 B2 | 6/2007 | Wang et al. |
| 7,255,640 B2 | 8/2007 | Aldag et al. |
| 7,372,695 B2 | 5/2008 | Coglitore et al. |
| 7,406,978 B2 | 8/2008 | Mintie et al. |
| 7,438,638 B2 | 10/2008 | Lewis, II et al. |
| 7,452,287 B2 | 11/2008 | Erickson et al. |
| 7,470,176 B2 | 12/2008 | Morris et al. |
| 7,500,911 B2 | 3/2009 | Johnson |
| 2003/0067747 A1* | 4/2003 | Hasegawa et al. ............ 361/695 |
| 2004/0099747 A1 | 5/2004 | Johnson et al. |
| 2005/0054282 A1 | 3/2005 | Green et al. |
| 2005/0225936 A1 | 10/2005 | Day |
| 2006/0199503 A1 | 9/2006 | Wang |
| 2006/0278215 A1 | 12/2006 | Gagas et al. |
| 2007/0064389 A1 | 3/2007 | Lewis, II et al. |
| 2007/0064391 A1 | 3/2007 | Lewis, II et al. |
| 2007/0171613 A1 | 7/2007 | McMahan et al. |
| 2007/0220846 A1 | 9/2007 | Ray |
| 2008/0029081 A1 | 2/2008 | Gagas et al. |
| 2008/0068791 A1 | 3/2008 | Ebermann |
| 2008/0316702 A1 | 12/2008 | Donowho et al. |
| 2008/0316703 A1 | 12/2008 | Donowho et al. |
| 2009/0190307 A1 | 7/2009 | Krietzman |
| 2009/0239461 A1 | 9/2009 | Lewis, II et al. |
| 2010/0061059 A1 | 3/2010 | Krietzman et al. |

FOREIGN PATENT DOCUMENTS

| | | |
|---|---|---|
| JP | 2000286580 A | 10/2000 |
| WO | 9106725 A1 | 5/1991 |

OTHER PUBLICATIONS

Chatsworth Products, Inc. Vertical Exhaust Duct System for F-Series Teraframe™ Cabinet System Product Information Sheet, Aug. 2008 (one page).

Chatsworth Products, Inc. Vertical Exhaust Duct System for F-Series Teraframe™ Cabinet System Product Information Sheet, Jan. 2009 (one page).

Hewlett-Packard 10000 G2 42U Rack Air Duct Installation Guide, Aug. 2008, (23 pages).

Hewlett-Packard 10000 G2 Rack Air Duct Kit Overview & Features webpage, Mar. 25, 2010 (1 page).

* cited by examiner

ADJUSTABLE VERTICAL EXHAUST DUCT

CROSS REFERENCE TO RELATED APPLICATIONS

This application claims priority to U.S. Provisional Patent Application No. 61/186,933, filed on Jun. 15, 2009, and U.S. Provisional Patent Application No. 61/164,499, filed on Mar. 30, 2009, each of which is incorporated by reference in its entirety.

BACKGROUND OF THE INVENTION

The present invention relates to an adjustable vertical exhaust duct and, in particular, the invention relates to an adjustable vertical exhaust duct to be mounted on a server cabinet in a data center room.

Currently available vertical exhaust ducts channel hot air from the server cabinet into the exhaust air plenum of the data center room. However, the server cabinets and the data center exhaust air plenums come in different heights, potentially leaving a variable gap between the top of the server cabinets and the plenum.

Therefore, there is a need for an adjustable vertical exhaust duct that will accommodate varying heights between server cabinets and exhaust air plenums to ensure that hot air is evacuated from the server cabinet and channeled into the exhaust air plenum.

SUMMARY OF THE INVENTION

Certain embodiments of the present invention provide a vertical exhaust duct for an electronic equipment enclosure. The vertical exhaust duct includes an inner duct section and an outer duct section. The inner duct section nests within the outer duct section and telescopes to adjust the height of the vertical exhaust duct.

In certain embodiments of the present invention, the outer duct section includes at least one elongated opening for securing the vertical exhaust duct at a desired height.

In certain embodiments of the present invention, the outer duct section includes at least one pawl for securing the vertical exhaust duct at a desired height.

DETAILED DESCRIPTION OF THE INVENTION

FIGS. 1-6 illustrate an adjustable vertical exhaust duct 30 which is mounted on server cabinet 32 in a data center room. Exhaust duct 30 will channel the hot air from server cabinet 32 into the exhaust air plenum of the data center room. Server cabinets 32 and the exhaust air plenums come in different heights, potentially leaving a variable gap between the top of server cabinets 32 and the plenums. Exhaust duct 30 can accommodate these varying heights.

Figure 1:
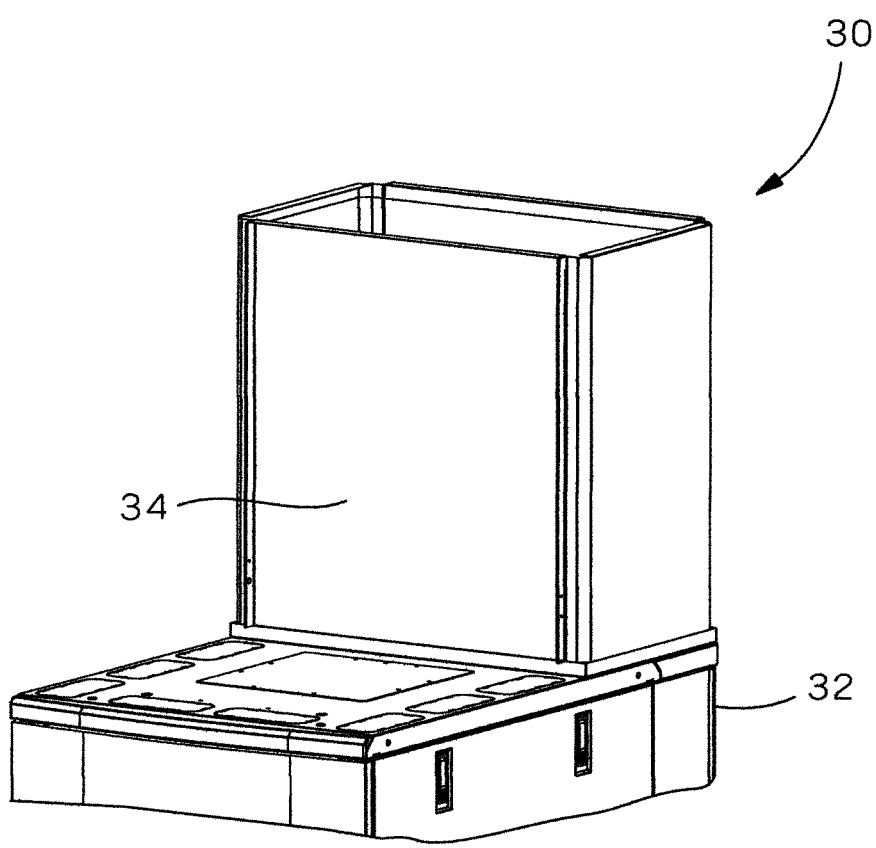
FIG. 1 is a top perspective view of an adjustable vertical exhaust duct in accordance with the present invention, wherein the exhaust duct is installed on the top of a server cabinet in the lowest position.
Figure 2:
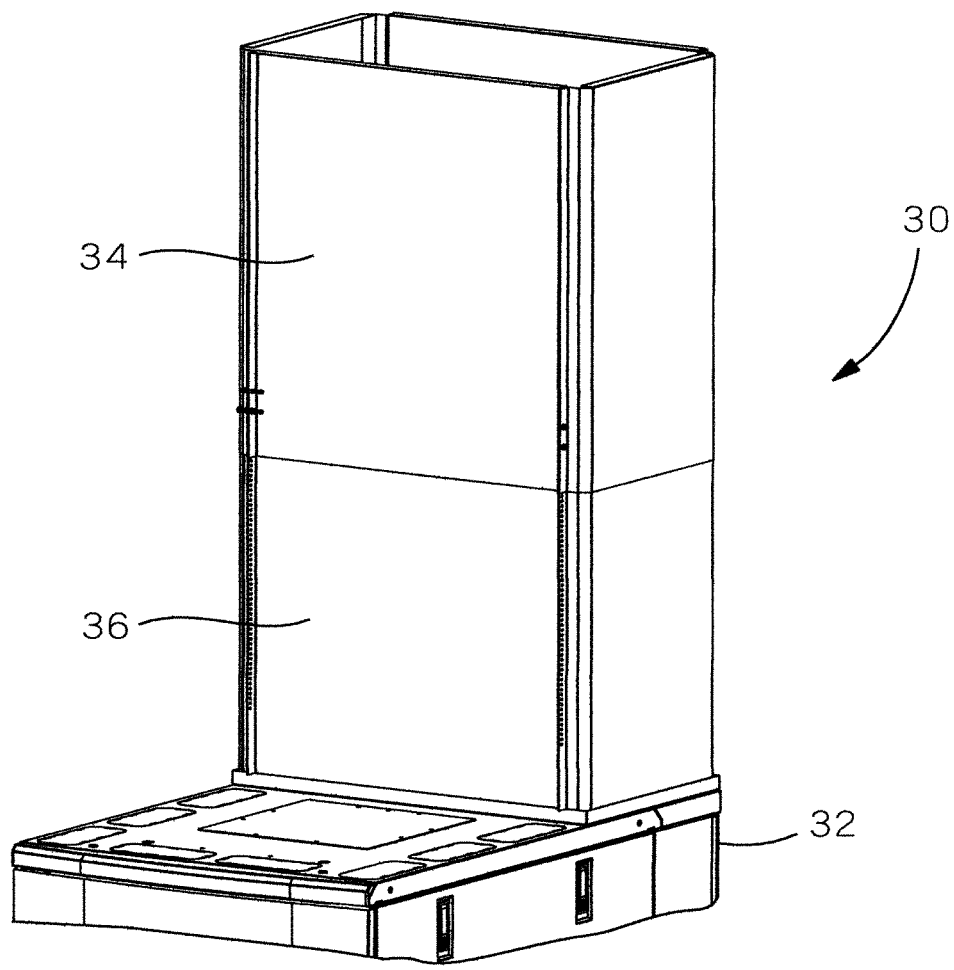
FIG. 2 is a top perspective view of the adjustable vertical exhaust duct of FIG. 1, wherein the exhaust duct is installed on the top of the server cabinet in a fully extended position.

FIG. 1 shows exhaust duct 30 installed on the top of server cabinet 32 in its lowest position, and FIG. 2 shows exhaust duct 30 in a fully extended position. Exhaust duct 30 includes outer duct section 34 and inner duct section 36. Preferably, outer duct section 34 is larger than inner duct section 36.

Figure 3:
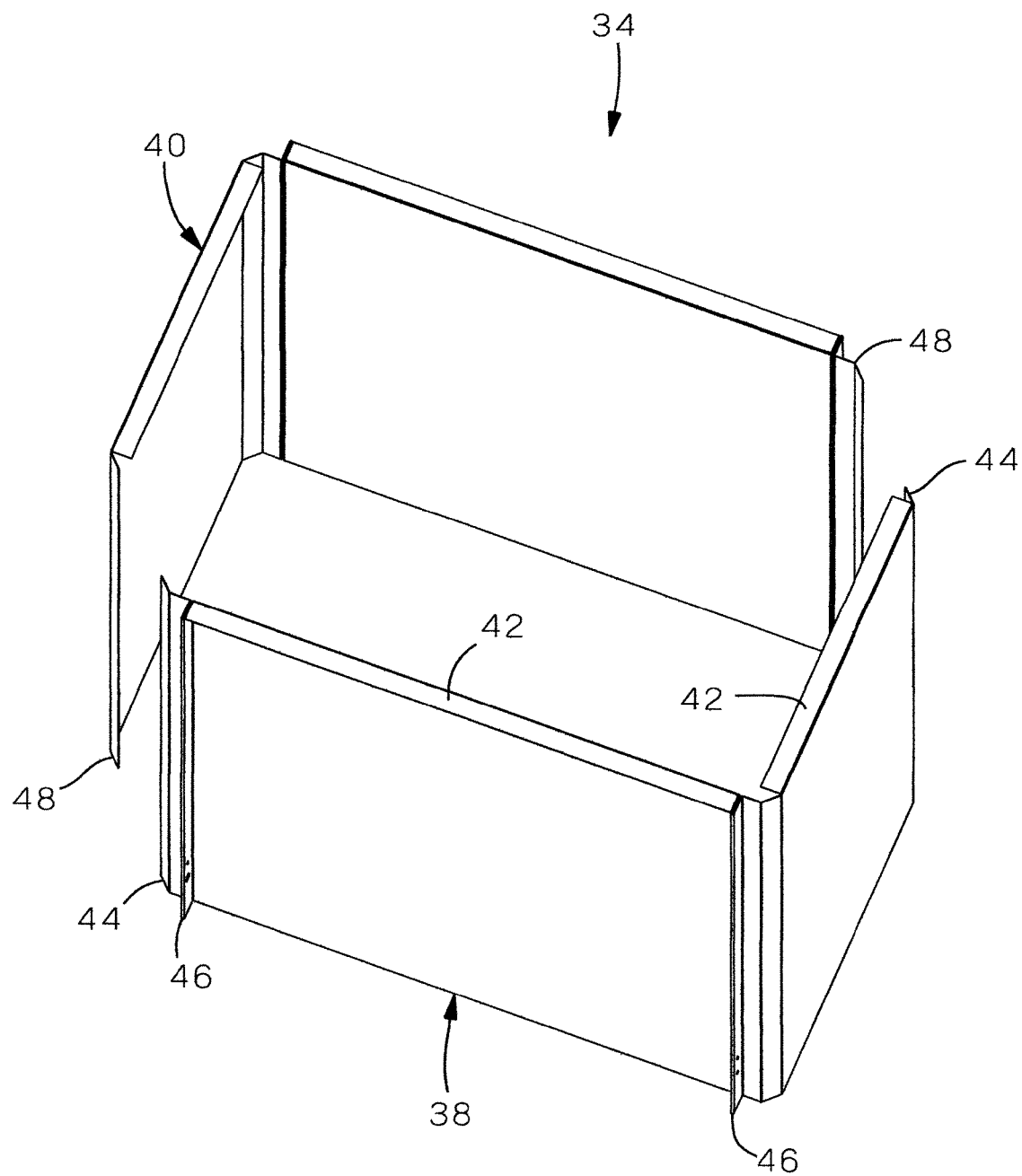
FIG. 3 is a top perspective view of two halves of an outer duct section of FIG. 2, before they are assembled together.

FIG. 3 shows the formed pieces of outer duct section 34. Outer duct section 34 comprises a first portion 38 and a second portion 40. First portion 38 has top flanges 42, side flanges 44 and four mating loop flanges 46. Top flanges 42 may include a foam gasket seal that will press against the exhaust air plenum to ensure that hot air is evacuated from server cabinet 32 and channeled into the exhaust air plenum. Side flanges 44 overlaps side flanges 48 on second portion 40 to allow first and second portions 38, 40 to be spot-welded or riveted together. Inner duct section 36 has a similar two-piece construction.

Figure 4:
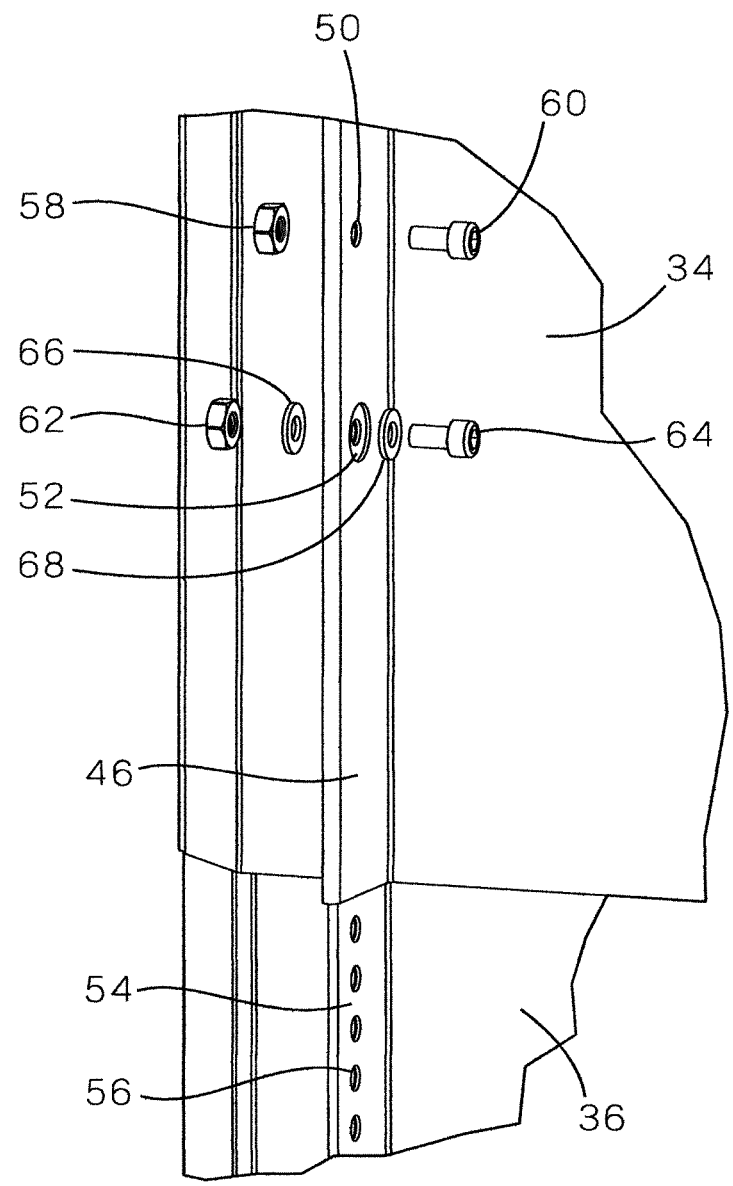
FIG. 4 is a detailed view of one of the locking systems and the grounding system of the adjustable vertical exhaust duct of FIG. 2, wherein four identical nut and bolt locking systems secure the outer duct section to an inner duct section.
Figure 5:
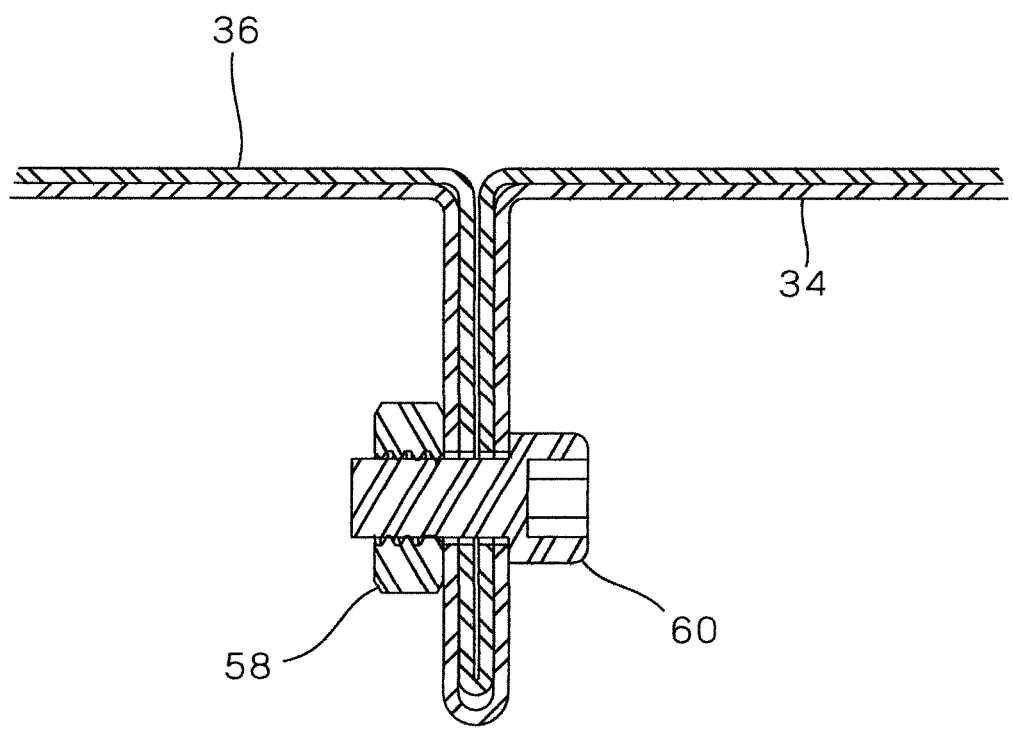
FIG. 5 is a cross-sectional view of the locking system of FIG. 4, wherein the locking system secures the outer duct section to the inner duct section.
Figure 6:
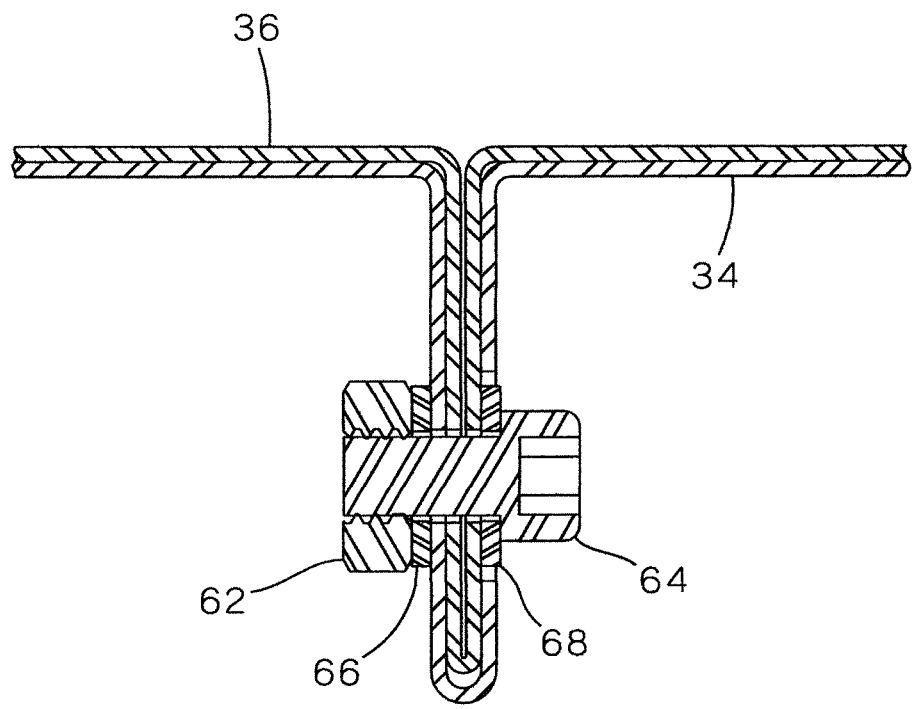
FIG. 6 is a cross-sectional view of the grounding system of FIG. 4, wherein the grounding system grounds the outer duct section to the inner duct section.

As shown in FIG. 4, outer duct section 34 includes a mating loop flange 46 having a first aperture 50 and a second aperture 52. Preferably, second aperture 52 is larger than first aperture 50. Inner duct section 36 includes a mating loop flange 54 having a plurality of apertures 56. Preferably, apertures 56 are the same size as first aperture 50 and smaller than second aperture 52. First aperture 50 is aligned with one of apertures 56 and a nut 58 and bolt 60 secure outer duct section 34 to inner duct section 36, as shown in FIG. 5. Similarly, second aperture 52 is aligned with a different one of apertures 56 and a nut 62, bolt 64 and two paint piercing washers 66, 68 secure outer duct section 34 to inner duct section 36, as well as ground the duct sections together. First washer 66 bites into outer duct section 34 and second washer 68 bites into inner duct section 36, as shown in FIG. 6.

In operation, an installer begins with exhaust duct 30 in its lowest position, as shown in FIG. 1. The installer raises outer duct section 34 up to the exhaust air plenum, aligns first aperture 50 with one of apertures 56 and installs bolt 60 to secure outer duct section 34 in place. Nut 58 is installed and tightened to secure the connection. Once the height has been set, bolt 64, first washer 66, second washer 68 and nut 62 are installed to ground outer duct section 34 to inner duct section 36. After installation, exhaust duct 30 may be in a partially extended position or the fully extended position shown in FIG. 2.

FIGS. 7-12 illustrate an adjustable vertical exhaust duct 130 which is mounted on server cabinet 132 in a data center room. Exhaust duct 130 will channel the hot air from server cabinet 132 into the exhaust air plenum of the data center room. Server cabinets 132 and the exhaust air plenums come in different heights, potentially leaving a variable gap between the top of server cabinets 132 and the plenums. Exhaust duct 130 can accommodate these varying heights.

Figure 7:
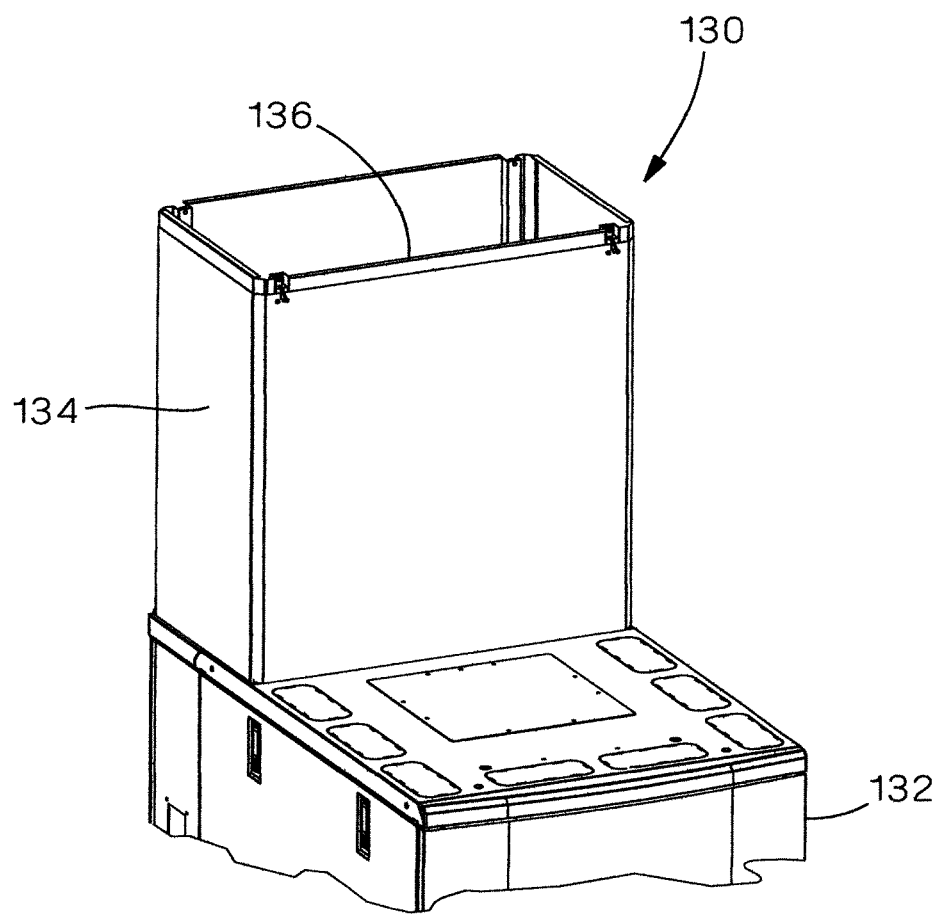
FIG. 7 is a top perspective view of an adjustable vertical exhaust duct in accordance with another embodiment of the present invention, wherein the exhaust duct is installed on the top of a server cabinet in the lowest position.
Figure 8:
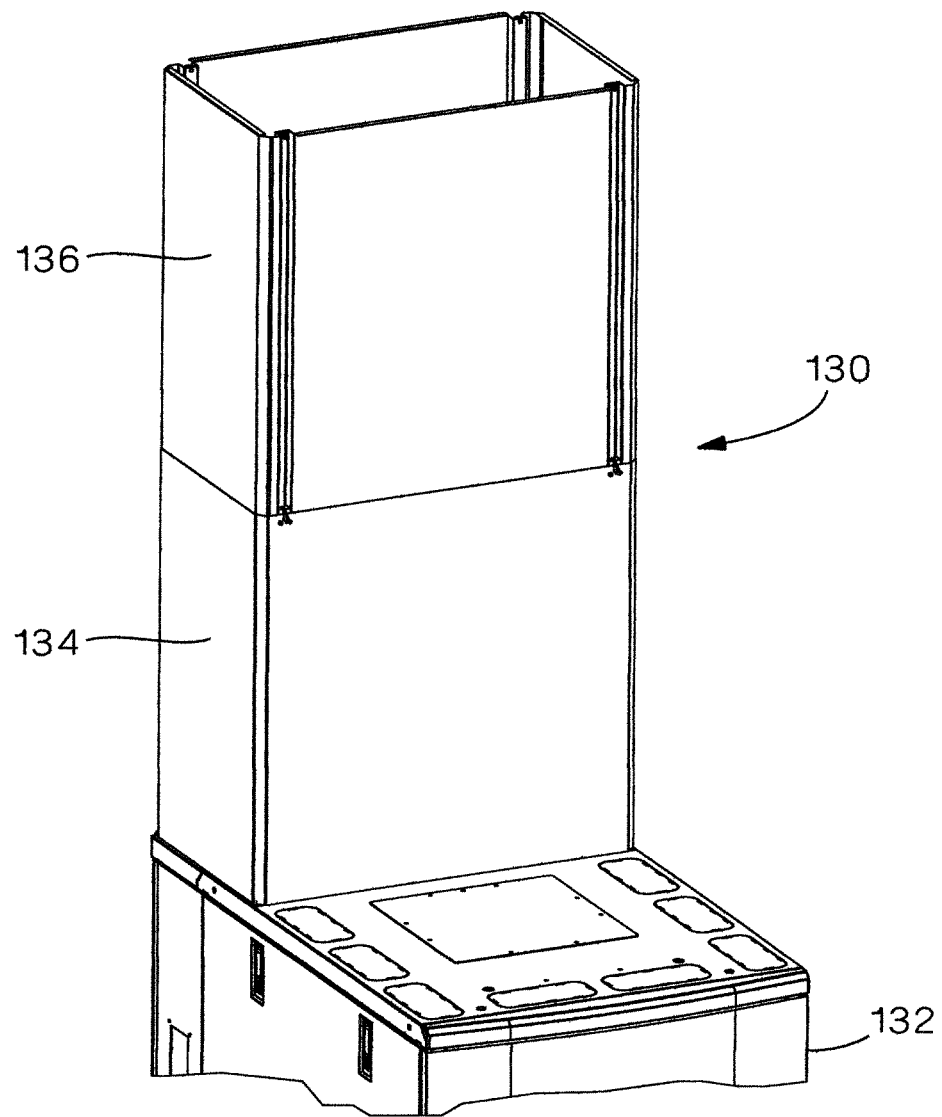
FIG. 8 is a top perspective view of the adjustable vertical exhaust duct of FIG. 7, wherein the exhaust duct is installed on the top of the server cabinet in a fully extended position.

FIG. 7 shows exhaust duct 130 installed on the top of server cabinet 132 in its lowest position, and FIG. 8 shows exhaust duct 130 in a fully extended position. Exhaust duct 130 includes outer duct section 134 and inner duct section 136. Preferably, outer duct section 134 is larger than inner duct section 136.

Figure 10:
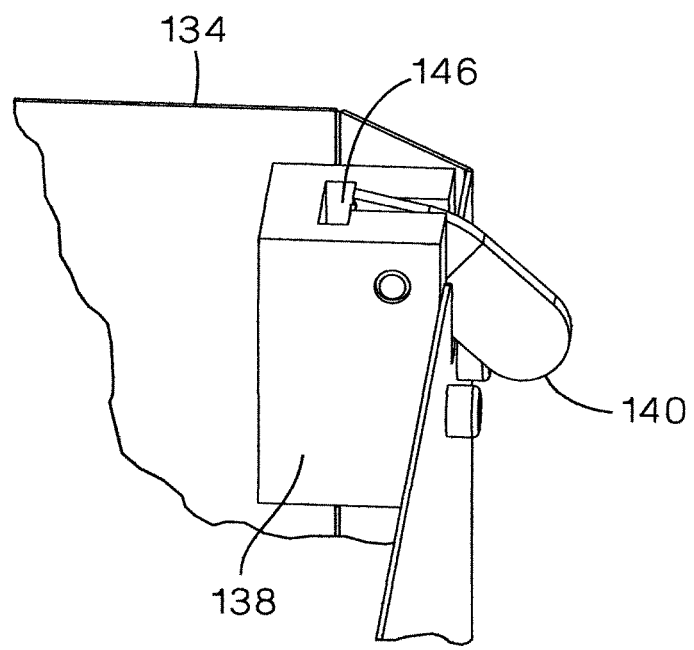
FIG. 10 is a top side perspective view of the outer duct section of FIG. 9.
Figure 12:
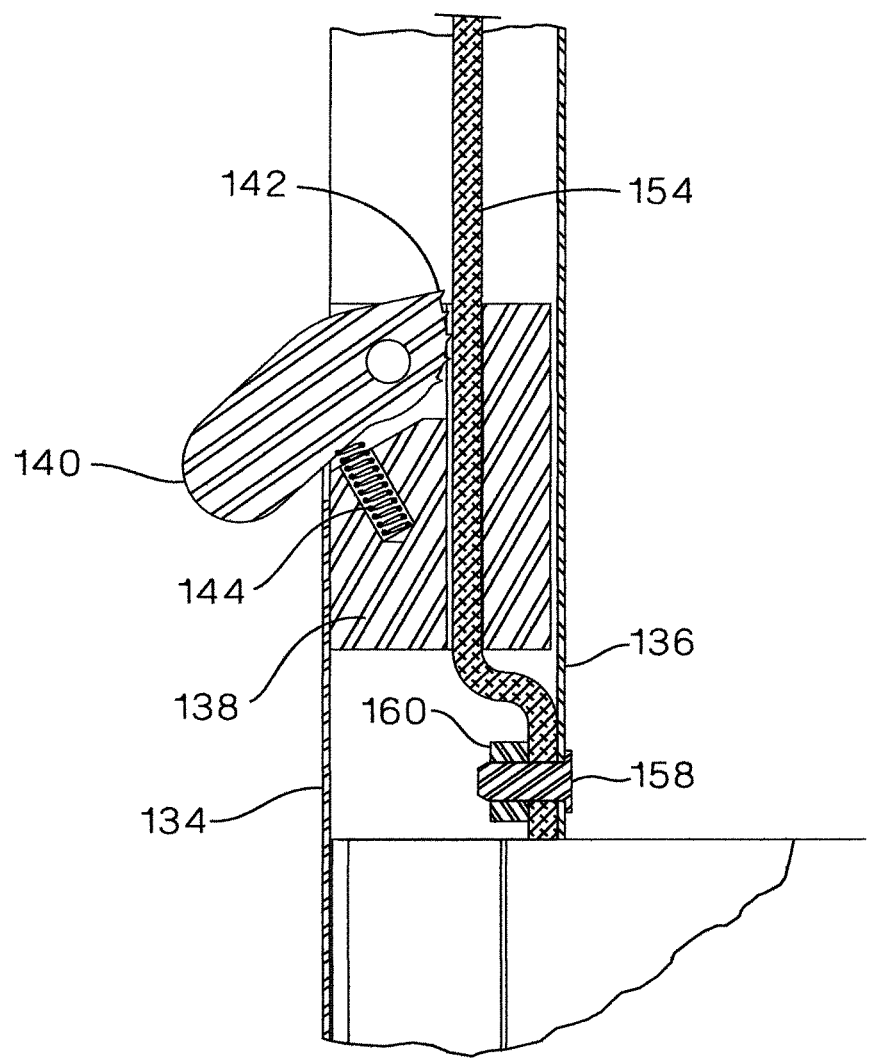
FIG. 12 is a cross-sectional view of the locking system of FIG. 9, wherein the locking system secures the outer duct section to the inner duct section.

As shown in FIGS. 10 and 12, outer duct section 134 includes locking block 138 bolted near the top edge of outer duct section 134. Locking block 138 comprises pawl 140 having a plurality of teeth 142, spring 144 and slot 146 for receiving an adjustment rod. Preferably, pawl 140 is steel.

Figure 9:
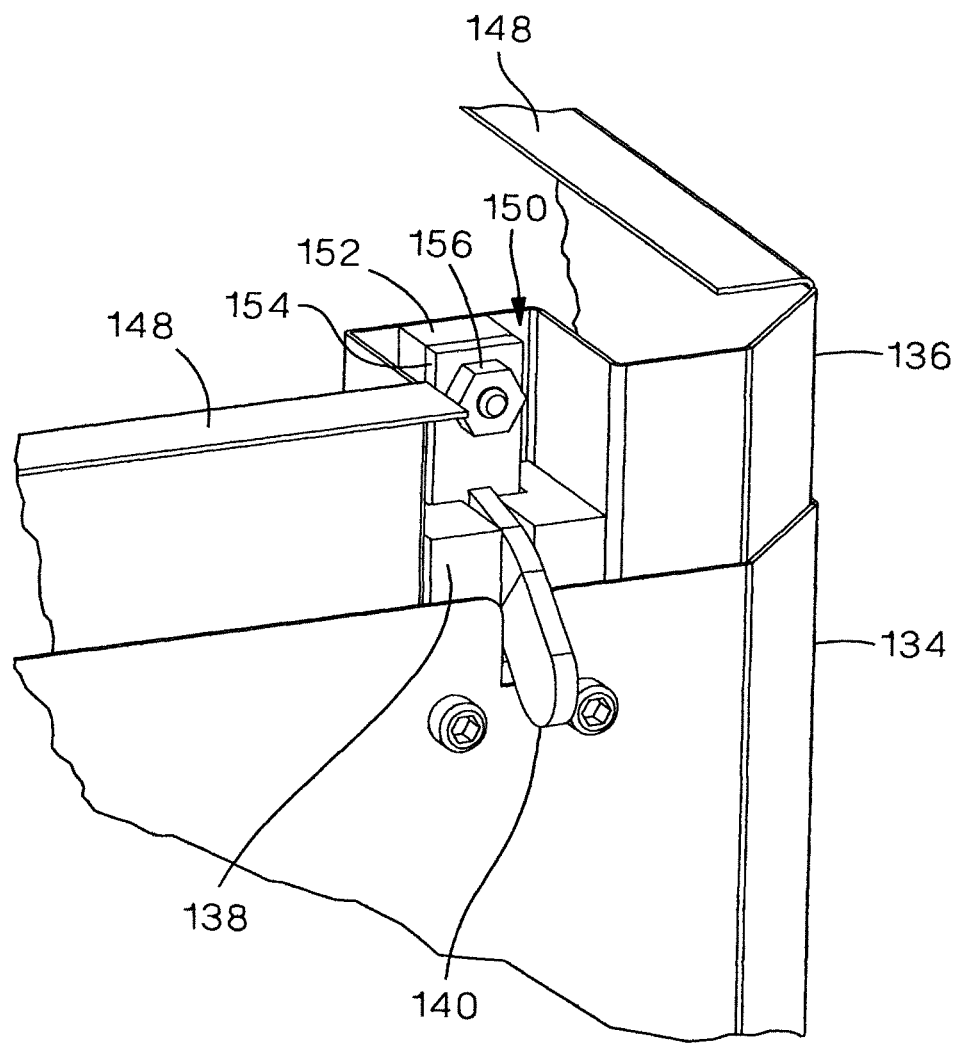
FIG. 9 is a detailed view of one of the locking systems of the adjustable vertical exhaust duct of FIG. 7, wherein four identical pawl locking systems secure an outer duct section to an inner duct section.
Figure 11:
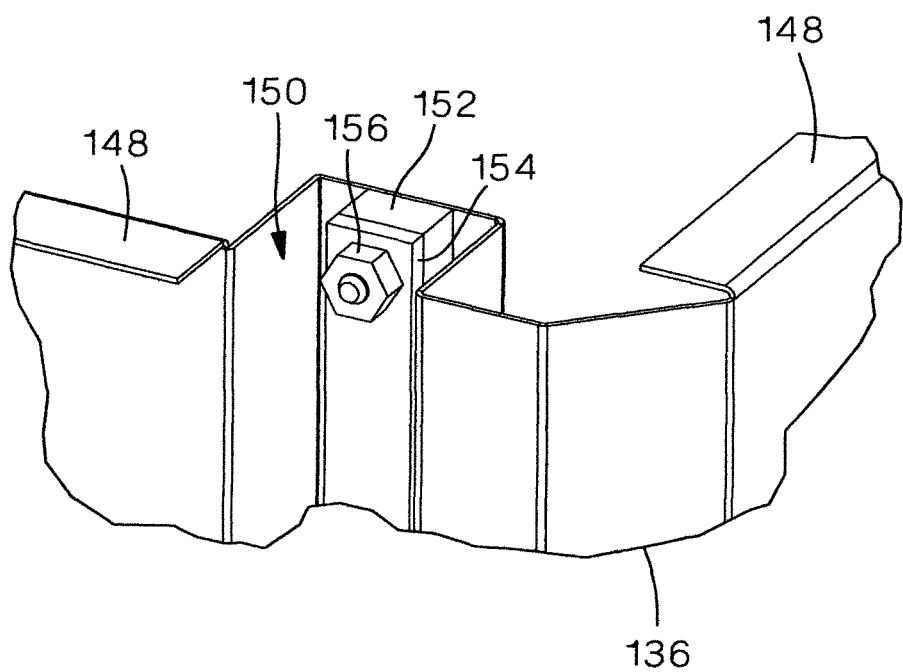
FIG. 11 is a top front perspective view of the inner duct section of FIG. 9.

As best seen in FIGS. 9 and 11, inner duct section 136 has top flanges 148 that may include a foam gasket seal that will press against the exhaust air plenum to ensure that hot air is evacuated from server cabinet 132 and channeled into the exhaust air plenum. Inner duct section 136 also has a channel 150 including spacer 152, adjustment bar 154 and nut 156. Preferably, adjustment bar 154 is aluminum. Before spacer 152 and nut 156 are installed, locking block 138 is assembled onto adjustment bar 154. FIG. 12 shows adjustment bar 154 attached to inner duct section 136 with stud 158 and nut 160.

In operation, an installer begins with exhaust duct 130 in its lowest position, as shown in FIG. 7. The installer raises inner duct section 136 up to the exhaust air plenum, and inner duct section 136 is automatically locked in place against the exhaust air plenum. As shown in FIG. 12, pawl 140 is spring-loaded against adjustment bar 154 and teeth 142 bite into adjustment bar 154 to prevent adjustment bar 154 from slipping downward during the adjustment of inner duct section 136. After installation, exhaust duct 130 may be in a partially extended position or the fully extended position shown in FIG. 8. To release and lower inner duct section 136, the installers need to push down on each of four pawls 140.

FIGS. 13-16 illustrate an adjustable vertical exhaust duct 230 which is mounted on server cabinet 232 in a data center room. Exhaust duct 230 will channel the hot air from server cabinet 232 into the exhaust air plenum of the data center room. Server cabinets 232 and the exhaust air plenums come in different heights, potentially leaving a variable gap between the top of server cabinets 232 and the plenums. Exhaust duct 230 can accommodate these varying heights.

Figure 13:
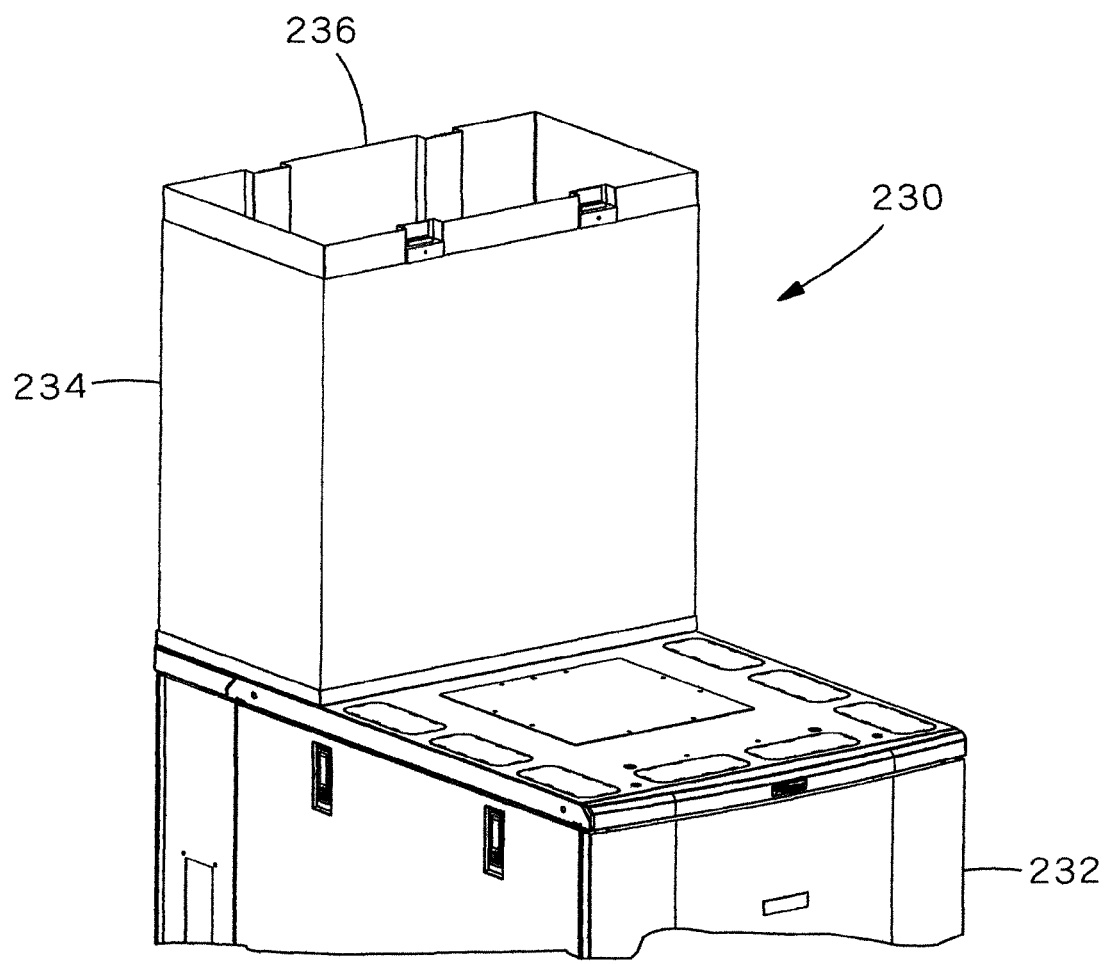
FIG. 13 is a top perspective view of an adjustable vertical exhaust duct in accordance with another embodiment of the present invention, wherein the exhaust duct is installed on the top of a server cabinet in the lowest position.
Figure 14:
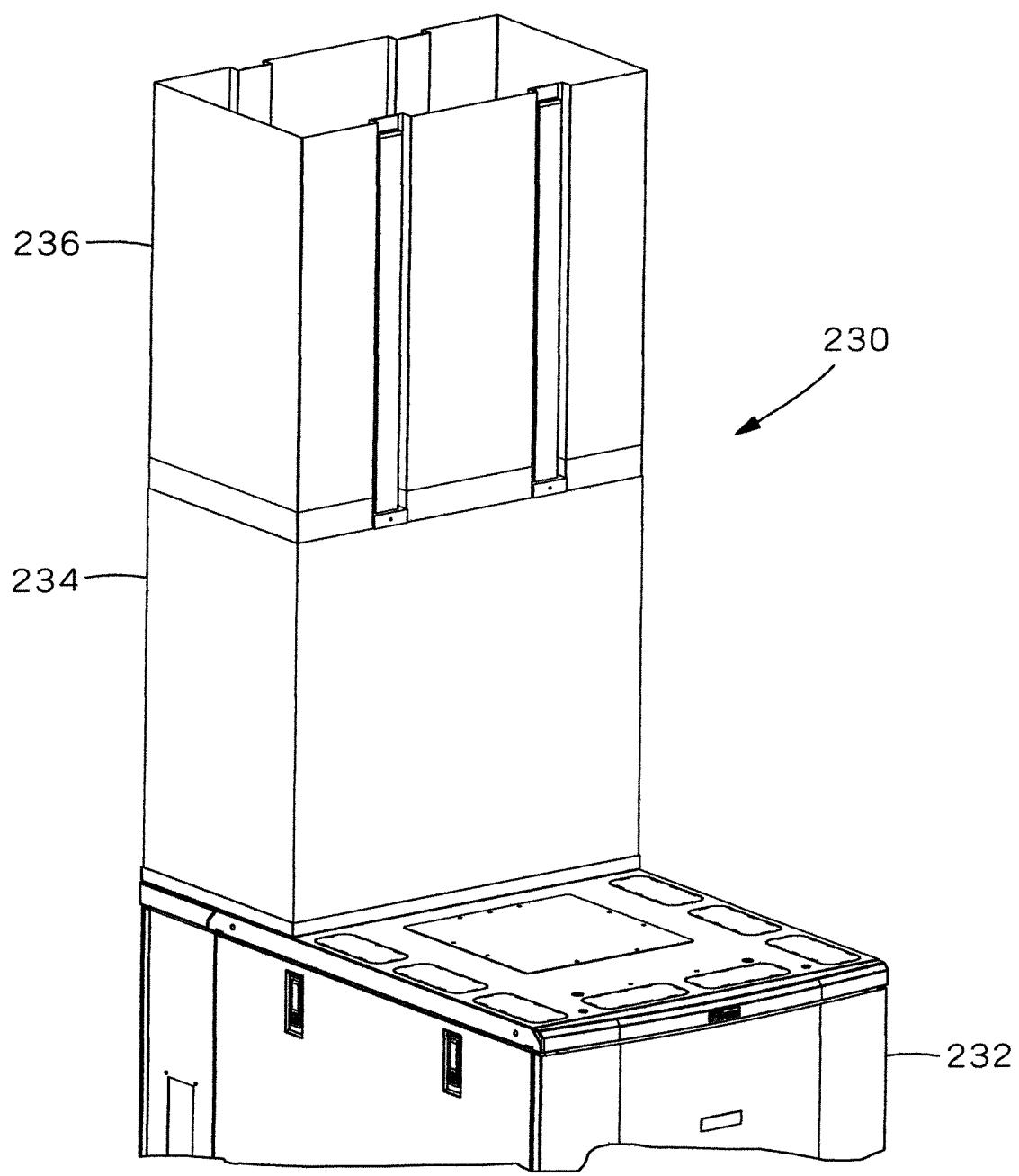
FIG. 14 is a top perspective view of the adjustable vertical exhaust duct of FIG. 13, wherein the exhaust duct is installed on the top of the server cabinet in a fully extended position.

FIG. 13 shows exhaust duct 230 installed on the top of server cabinet 232 in its lowest position, and FIG. 14 shows exhaust duct 230 in a fully extended position. Exhaust duct 230 includes outer duct section 234 and inner duct section 236. Preferably, outer duct section 234 is larger than inner duct section 236.

Figure 15:
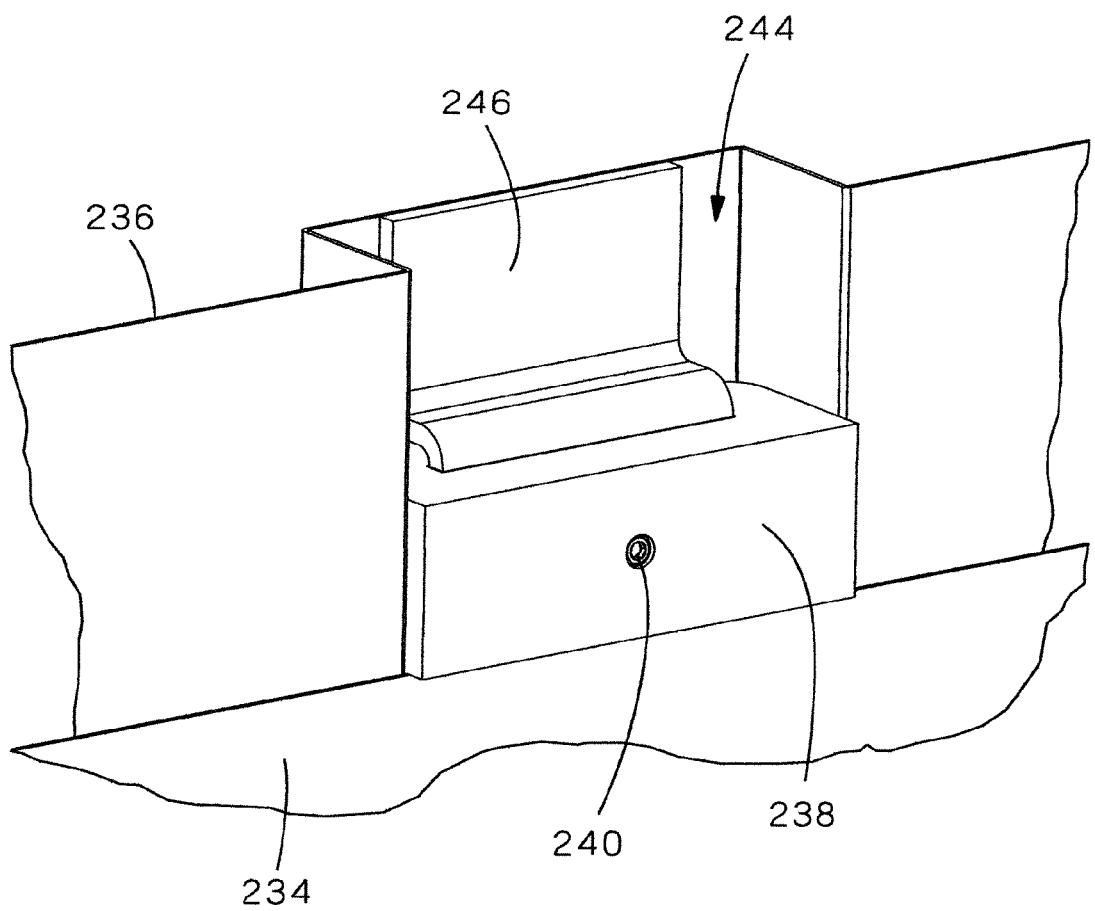
FIG. 15 is a detailed view of one of the locking systems of the adjustable vertical exhaust duct of FIG. 14, wherein four identical locking systems support the inner duct section on the outer duct section.
Figure 16:
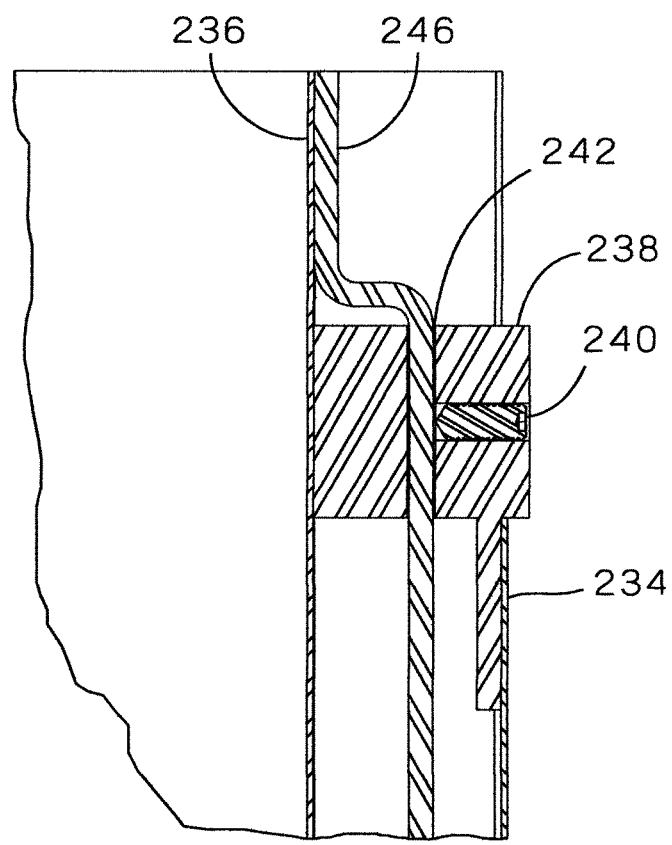
FIG. 16 is a cross-sectional view of the locking system of FIG. 15.

As shown in FIGS. 15 and 16, outer duct section 234 includes locking block 238 and set screw 240. Locking block 238 can sit on the top edge of outer duct section 234 or locking block 238 can be attached to outer duct section 234 by known attachment means. Locking block 238 has slot 242 for receiving an adjustment bar.

Inner duct section 236 may include top flanges and a foam gasket seal that will press against the exhaust air plenum to ensure that hot air is evacuated from server cabinet 232 and channeled into the exhaust air plenum. As best seen in FIG. 15, inner duct section 236 also includes channel 244 having adjustment bar 246.

In operation, an installer begins with exhaust duct 230 in its lowest position, as shown in FIG. 13. The installer raises inner duct section 236 up to the exhaust air plenum, holds inner duct section 236 in place and tightens the four set screws 240 to prevent inner duct section 236 from sliding back down inside outer duct section 234. After installation, exhaust duct 230 may be in a partially extended position or the fully extended position shown in FIG. 14. To release and lower inner duct section 236, the installers need to hold onto inner duct section 236 and loosen four set screws 240. Inner duct section 236 is now free to move down.

FIGS. 17-21 illustrate an adjustable vertical exhaust duct 330 which is mounted on server cabinet 332 in a data center room. Exhaust duct 330 will channel the hot air from server cabinet 332 into the exhaust air plenum of the data center room. Server cabinets 332 and the exhaust air plenums come in different heights, potentially leaving a variable gap between the top of server cabinets 332 and the plenums. Exhaust duct 330 can accommodate these varying heights.

Figure 17:
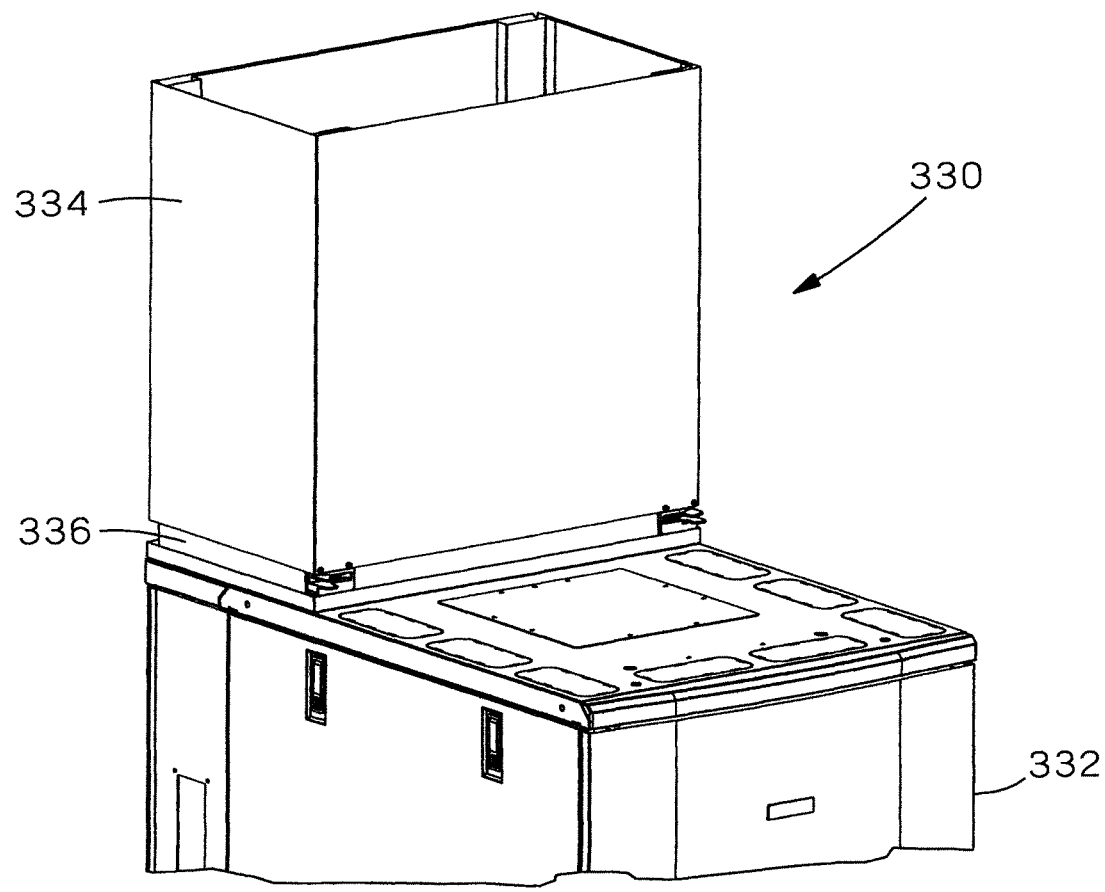
FIG. 17 is a top perspective view of an adjustable vertical exhaust duct in accordance with another embodiment of the present invention, wherein the exhaust duct is installed on the top of a server cabinet in the lowest position.
Figure 18:
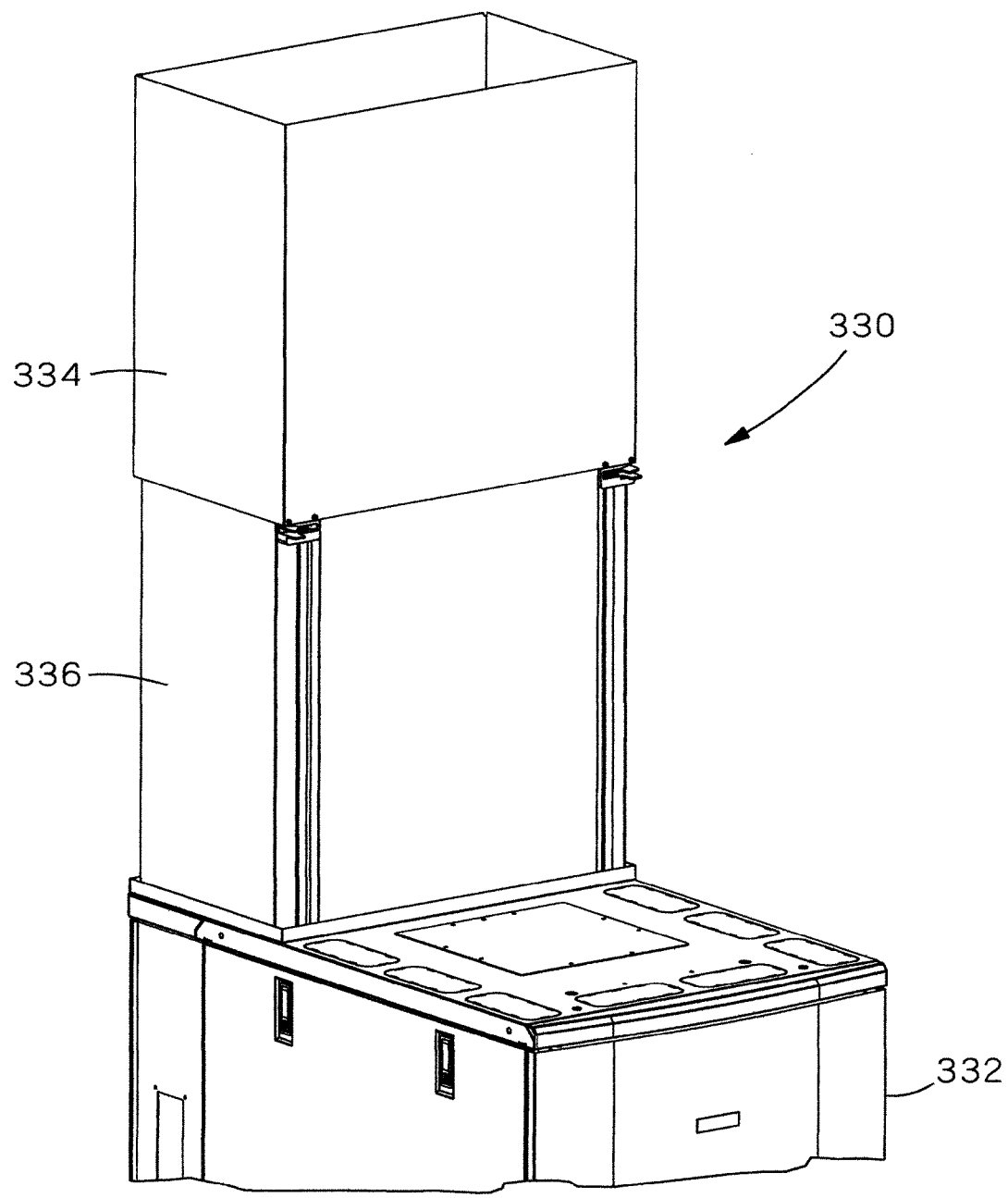
FIG. 18 is a top perspective view of the adjustable vertical exhaust duct of FIG. 17, wherein the exhaust duct is installed on the top of the server cabinet in a fully extended position.

FIG. 17 shows exhaust duct 330 installed on the top of server cabinet 332 in its lowest position, and FIG. 18 shows exhaust duct 330 in a fully extended position. Exhaust duct 330 includes outer duct section 334 and inner duct section 336. Preferably, outer duct section 334 is larger than inner duct section 336.

Figure 19:
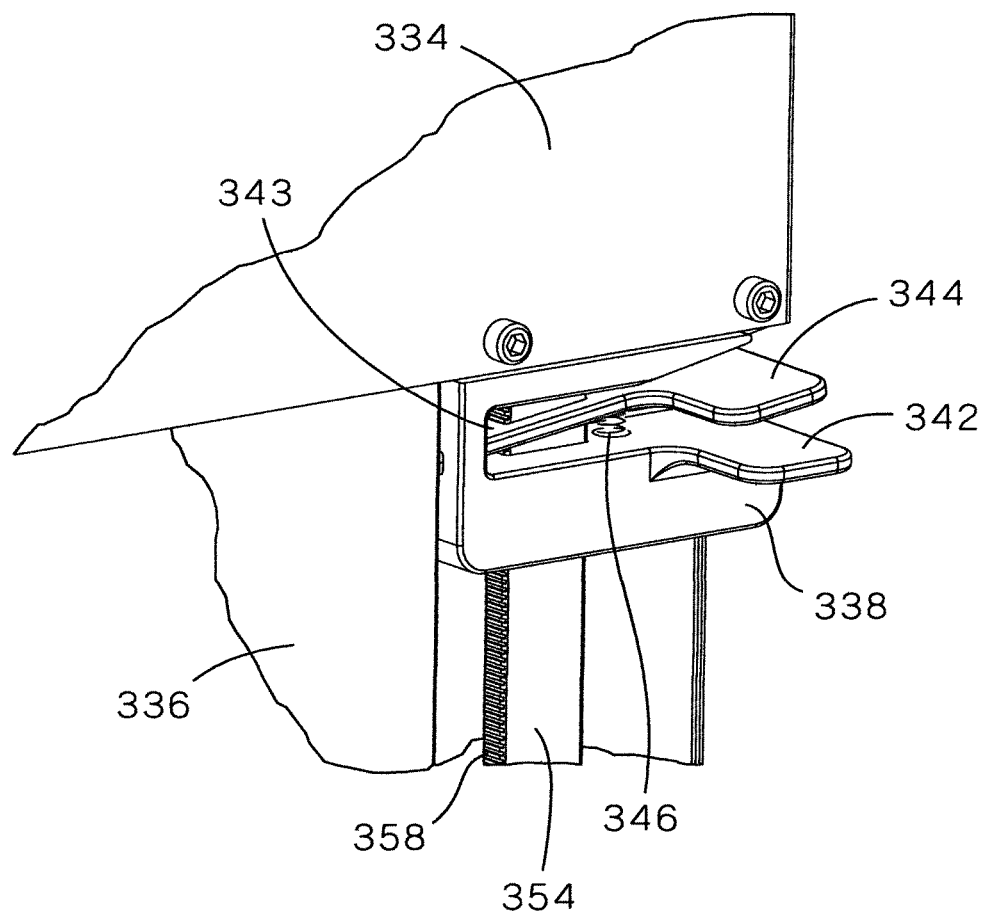
FIG. 19 is a detailed view of one of the locking systems of the adjustable vertical exhaust duct of FIG. 18, wherein four identical bar clamp locking systems secure an outer duct section to an inner duct section.
Figure 20:
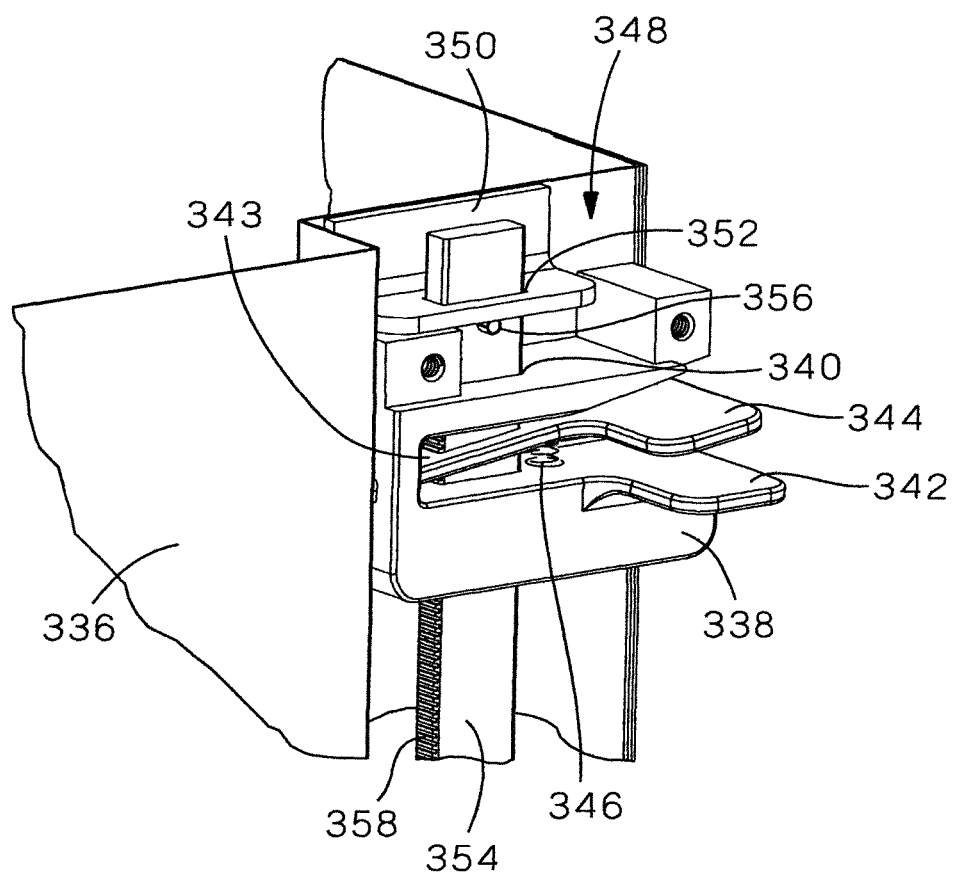
FIG. 20 is a detailed view of the adjustable vertical exhaust duct of FIG. 19, wherein the outer duct section has been removed.

As shown in FIGS. 19 and 20, outer duct section 334 includes locking block 338 bolted near the bottom edge of outer duct section 334. Locking block 338 comprises a slot 340 for receiving an adjustment rod, lock block tab 342, bar lock 343 having bar lock tab 344 and spring 346.

Inner duct section 336 may have top flanges and a foam gasket seal that will press against the exhaust air plenum to ensure that hot air is evacuated from server cabinet 332 and channeled into the exhaust air plenum. Inner duct section 336 also has a channel 348, and channel 348 includes mounting bracket 350 having slot 352 for receiving adjustment bar 354 and roll pin 356. Adjustment bar 354 is attached to inner duct section 336 through mounting bracket 350 and retained by roll pin 356. Preferably, adjustment bar 354 has teeth 358 on one side for engaging bar lock 343.

Figure 21:
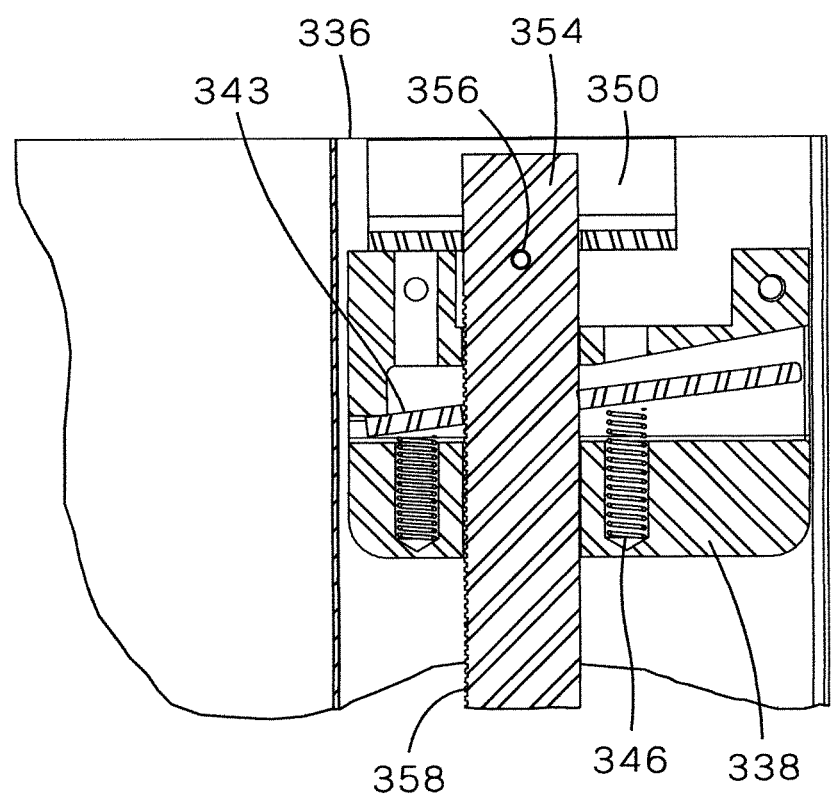
FIG. 21 is a cross-sectional view of the locking system of FIG. 20, wherein the locking system secures the outer duct section to the inner duct section.

In operation, an installer begins with exhaust duct 330 in its lowest position, as shown in FIG. 17. The installer raises outer duct section 334 up to the exhaust air plenum, and outer duct section 334 is automatically locked in place against the exhaust air plenum. As shown in FIG. 21, compression spring 346 forces bar lock 343 at an angle with respect to adjustment bar 354 causing the edge of the slot opening in bar lock 343 to bite into teeth 358 of adjustment bar 354, thus locking outer duct section 334 at any point along adjustment bar 354. After installation, exhaust duct 330 may be in a partially extended position or the fully extended position shown in FIG. 18. To release and lower outer duct section 334, the installers need to squeeze bar lock tabs 344 against lock block tabs 342 that are located on all four corners of outer duct section 334. Outer duct section 334 is then free to move down.

FIGS. 22-27 illustrate an adjustable vertical exhaust duct 430 which is mounted on a server cabinet in a data center room. Exhaust duct 430 will channel the hot air from the server cabinet into the exhaust air plenum of the data center room. The server cabinets and the exhaust air plenums come in different heights, potentially leaving a variable gap between the top of the server cabinets and the plenums. Exhaust duct 430 can accommodate these varying heights.

Figure 22:
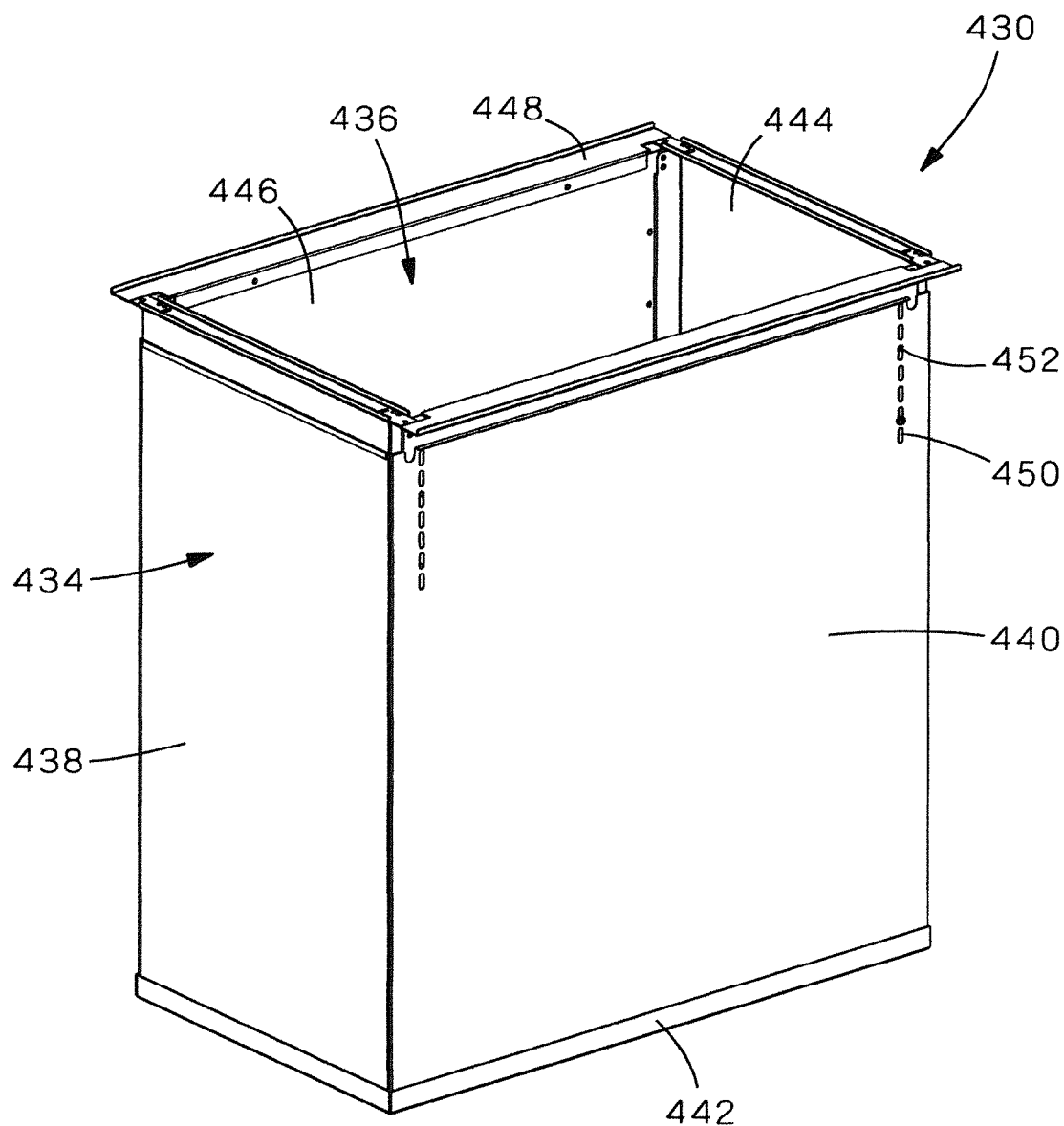
FIG. 22 is a top perspective view of an adjustable vertical exhaust duct in accordance with another embodiment of the present invention, wherein the exhaust duct is shown in the lowest position.
Figure 23:
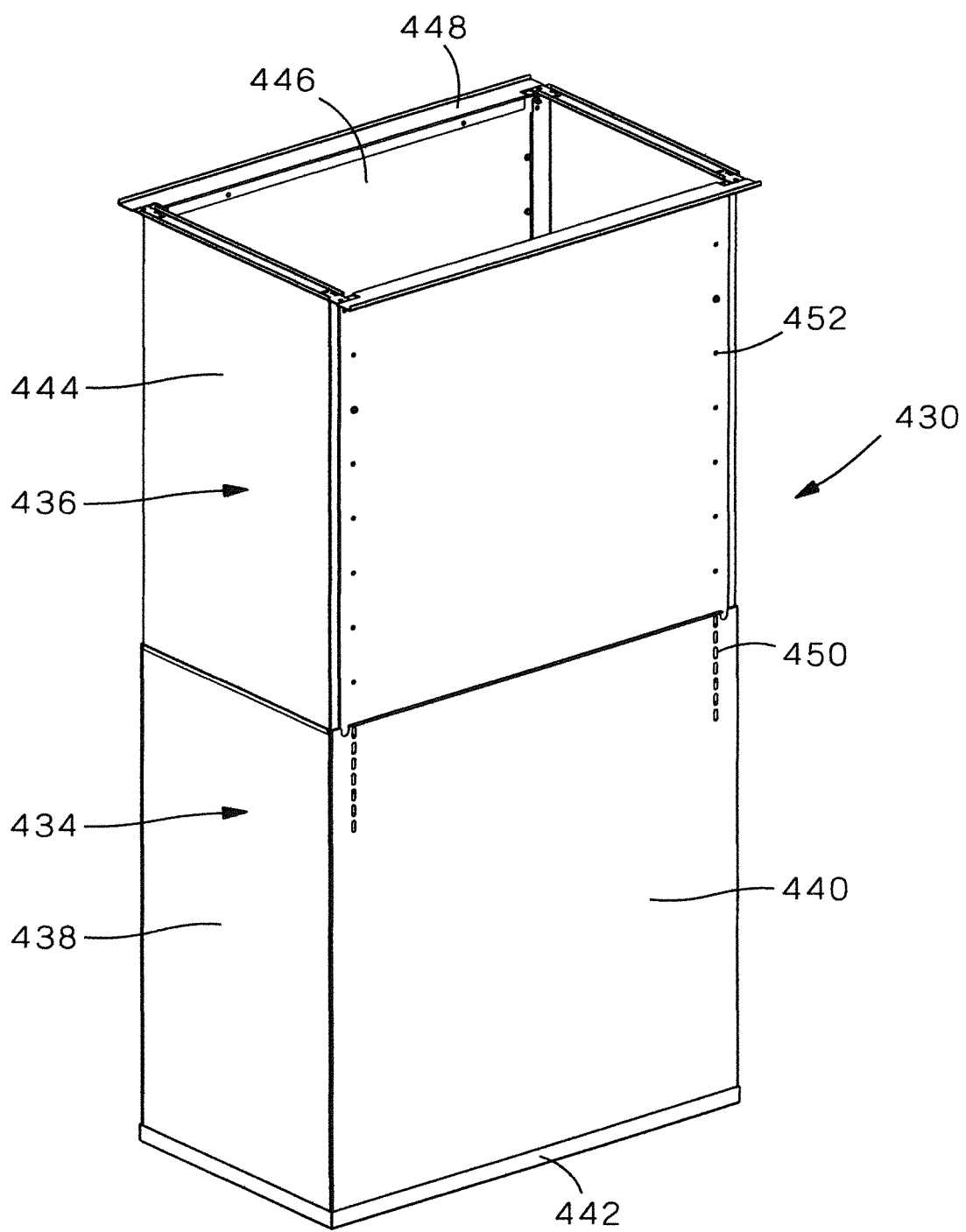
FIG. 23 is a top perspective view of the adjustable vertical exhaust duct of FIG. 22, wherein the exhaust duct is shown in a fully extended position.

FIG. 22 shows exhaust duct 430 in its lowest position, and FIG. 23 shows exhaust duct 430 in a fully extended position. In its lowest position, exhaust duct 430 is preferably 34 inches high. In the fully extended position, exhaust duct 430 is preferably 60 inches high. Exhaust duct 430 includes outer duct section 434 and inner duct section 436. Preferably, outer duct section 434 is larger than inner duct section 436.

Figure 24:
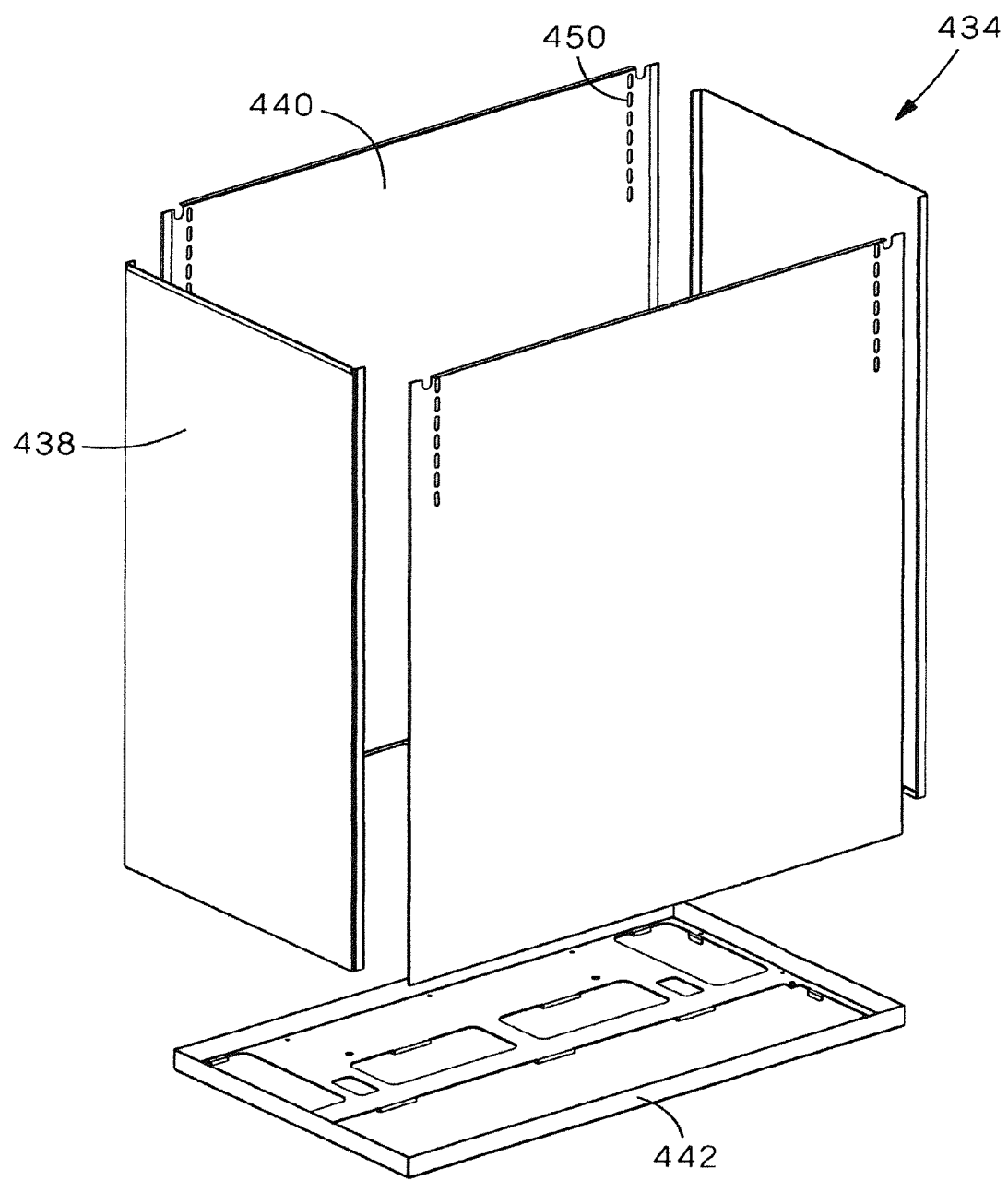
FIG. 24 is a top perspective view of the components of an outer duct section of FIG. 23, before they are assembled together.
Figure 25:
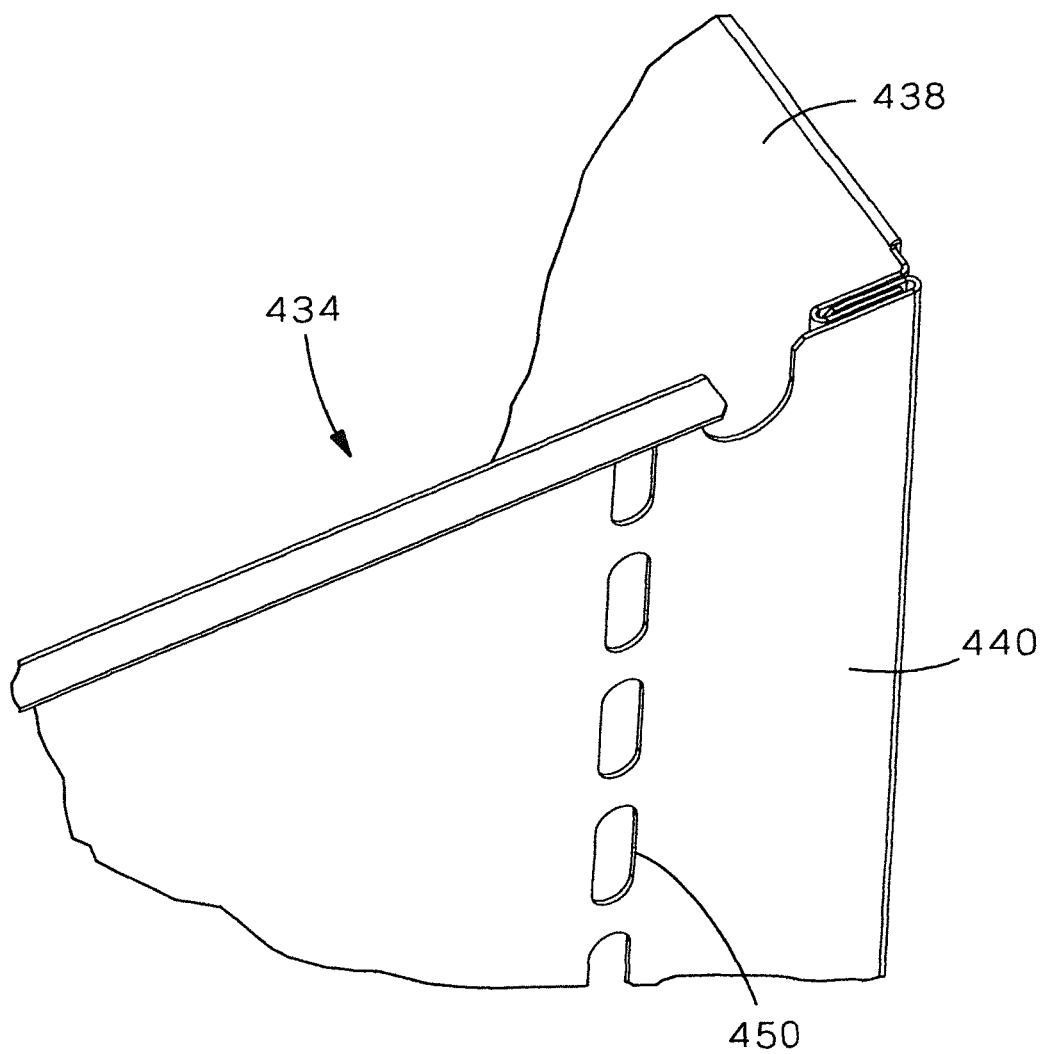
FIG. 25 is a detailed view of a portion of the outer duct section of FIG. 24 after assembly.

FIG. 24 shows the formed pieces of outer duct section 434. Outer duct section 434 comprises two end panels 438, two side panels 440 and duct bottom 442. As shown in FIG. 25, end panels 438 and side panels 440 hook together at the corners using open hems on each piece and are held together with threaded fasteners. The end panel and side panel assembly is attached to duct bottom 442.

Figure 26:
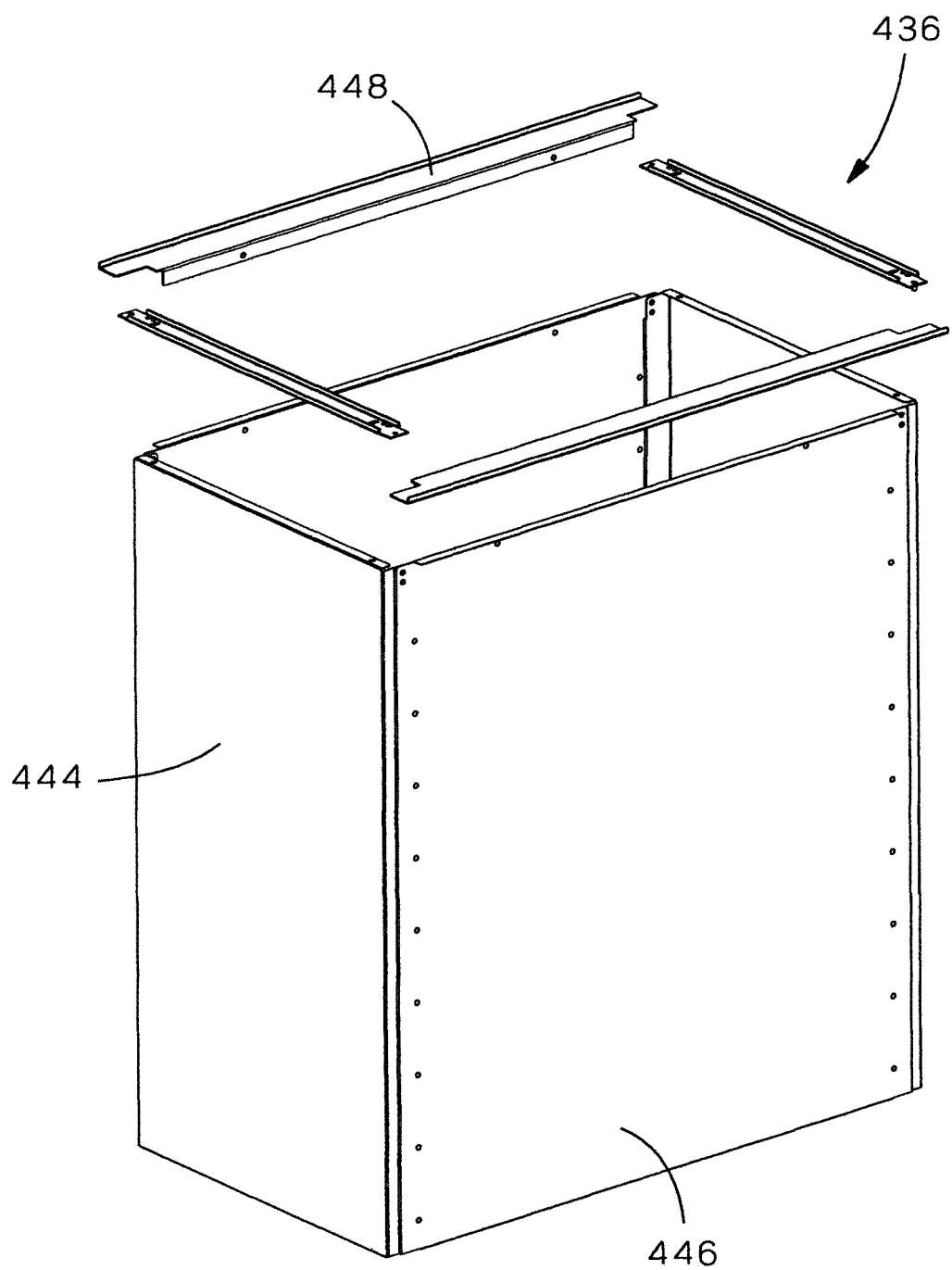
FIG. 26 is a top perspective view of the components of an inner duct section of FIG. 23, partially assembled.

FIG. 26 shows the formed pieces of inner duct section 436. Inner duct section 436 comprises two end panels 444, two side panels 446 and top flanges 448. End panels 444 and side panels 446 hook together at the corners using open hems on each piece and are held together with threaded fasteners. Top flanges 448 are attached to the top edges of inner duct section 436. Top flanges 448 may include a foam gasket seal that will press against the exhaust air plenum to ensure that hot air is evacuated from the server cabinet and channeled into the exhaust air plenum.

Figure 27:
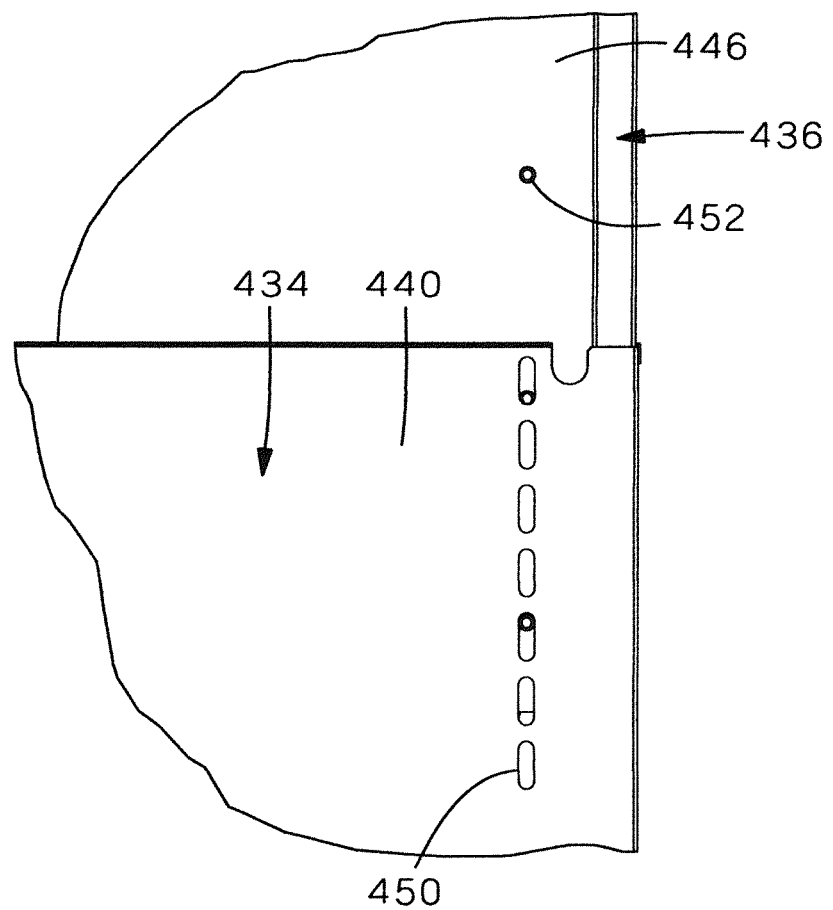
FIG. 27 is a detailed view of one of the locking systems of the adjustable vertical exhaust duct of FIG. 23, wherein four identical nut, screw and slot locking systems secure the outer duct section to the inner duct section.

Outer duct section 434 includes a plurality of slots 450. Preferably, each slot 450 is identical. Inner duct section 436 includes a plurality of apertures having a plurality of nuts 452. Preferably, each aperture is identical and each nut 452 is a PEM nut. As shown in FIG. 27, slots 450 in outer duct section 434 align with nuts 452 on inner duct section 436 and screws hold outer and inner duct sections 434, 436 together at the desired height. The screws may include paint piercing washers to ground outer and inner duct sections 434, 436 together. Also, outer duct section 434 overlaps inner duct section 436 to cover each slot 450 and prevent air leakage.

In operation, an installer begins with exhaust duct 430 in its lowest position, as shown in FIG. 22. The installer raises inner duct section 436 up to the exhaust air plenum, aligns slots 450 in outer duct section 434 and nuts 452 on inner duct section 436, and installs screws to secure outer duct section 434 to inner duct section 436. After installation, exhaust duct 430 may be in a partially extended position or the fully extended position shown in FIG. 23.

FIGS. 28-31 illustrate an adjustable vertical exhaust duct 530 which is mounted on server cabinet 532 in a data center room. Exhaust duct 530 will channel the hot air from server cabinet 532 into the exhaust air plenum of the data center room. Server cabinets 532 and the exhaust air plenums come in different heights, potentially leaving a gap between the top of server cabinets 532 and the plenums. Exhaust duct 530 can accommodate these varying heights.

Figure 28:
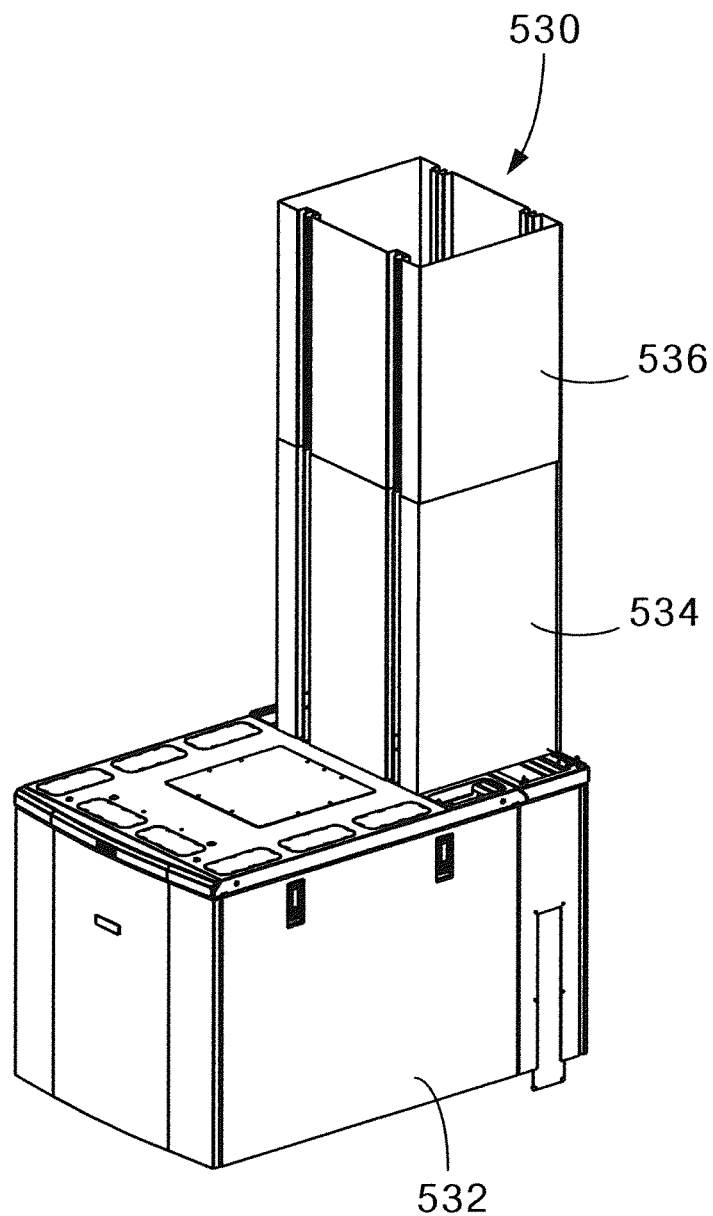
FIG. 28 is a top perspective view of an adjustable vertical exhaust duct in accordance with another embodiment of the present invention, wherein the exhaust duct is installed on the top of a server cabinet in a fully extended position.
Figure 29:
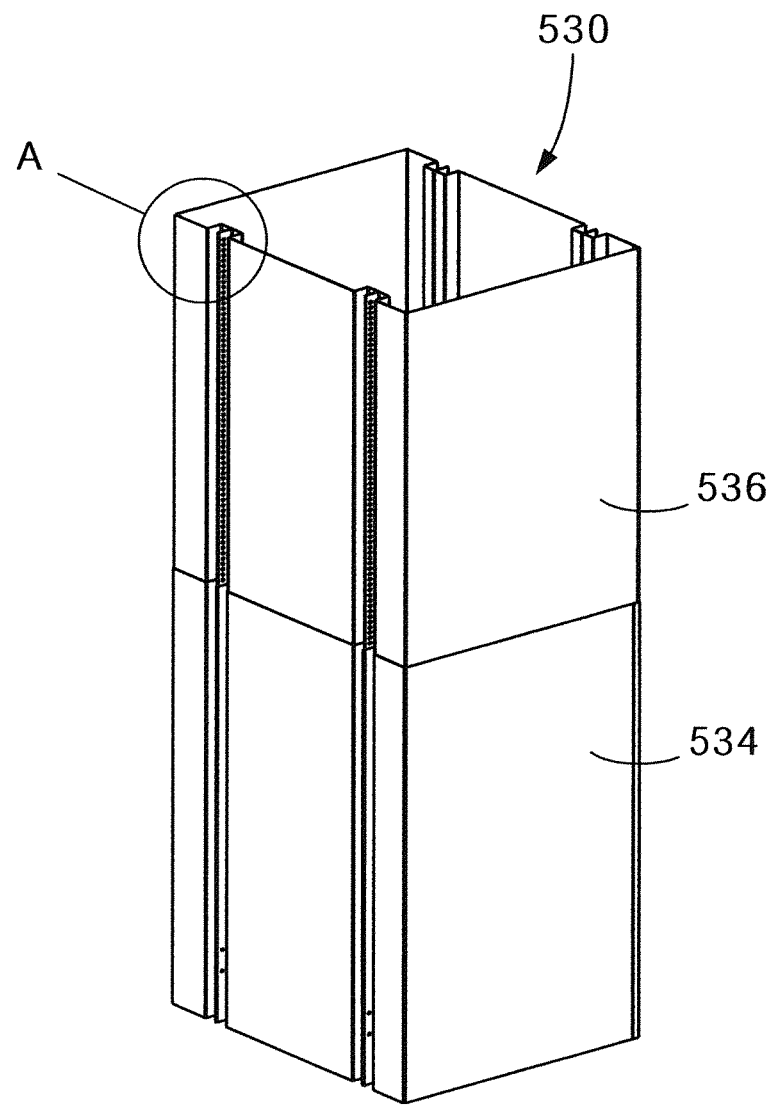
FIG. 29 is a top perspective view of the adjustable vertical exhaust duct of FIG. 28.
Figure 30:
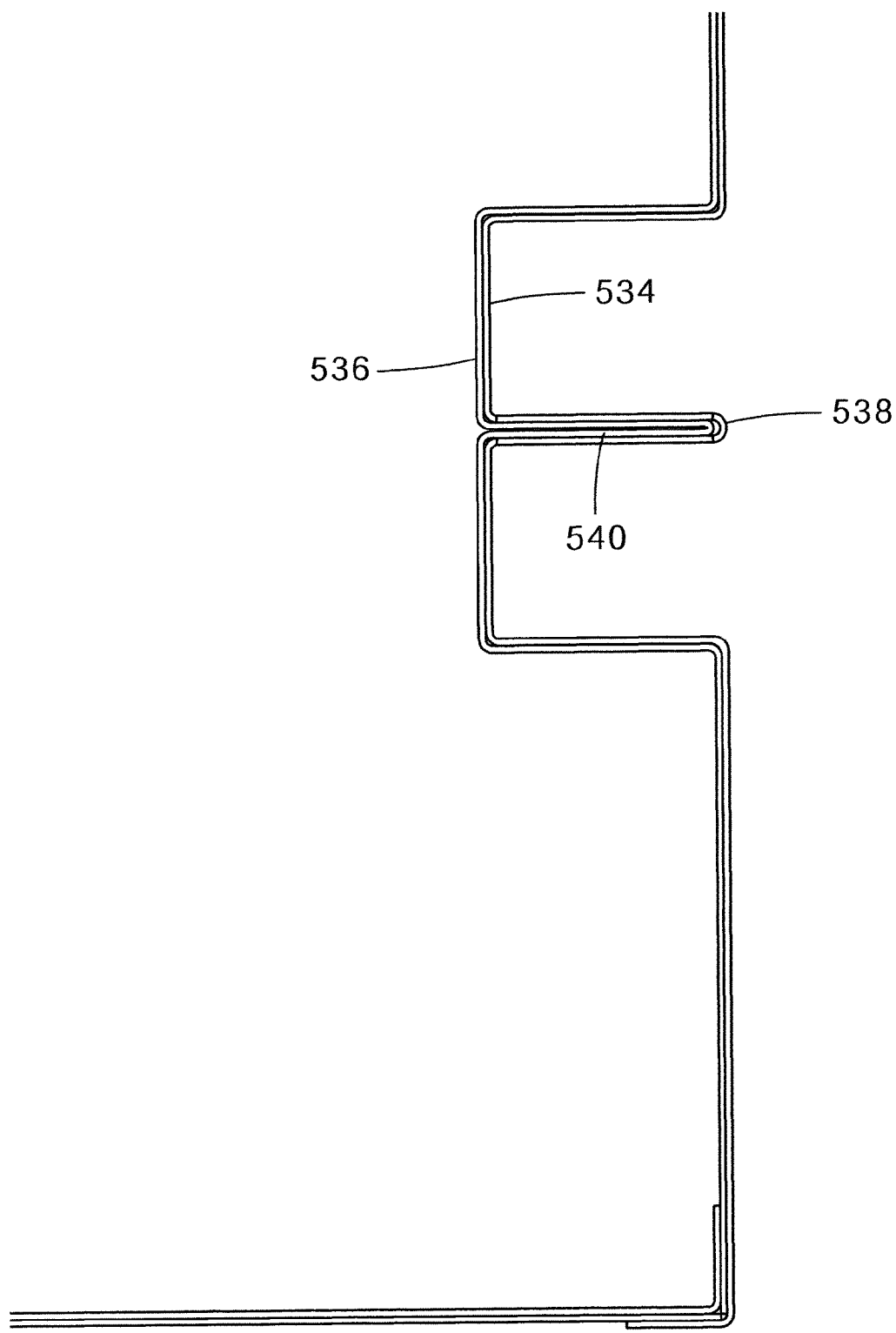
FIG. 30 is a detailed view of section A of FIG. 29.

FIG. 28 shows exhaust duct 530 installed on the top of server cabinet 532 in its fully extended position. As best seen in FIG. 29, exhaust duct 530 includes lower duct section 534 and upper duct section 536. Preferably, lower duct section 534 is larger than upper duct section 536. Exhaust duct 530 is similar to exhaust duct 30 shown in FIGS. 1-6, except exhaust duct 530 has recessed mating loop flanges 538, 540 that create an adjustment channel recessed from the front face of lower duct section 534 and upper duct section 536 (see FIG. 30).

Figure 31:
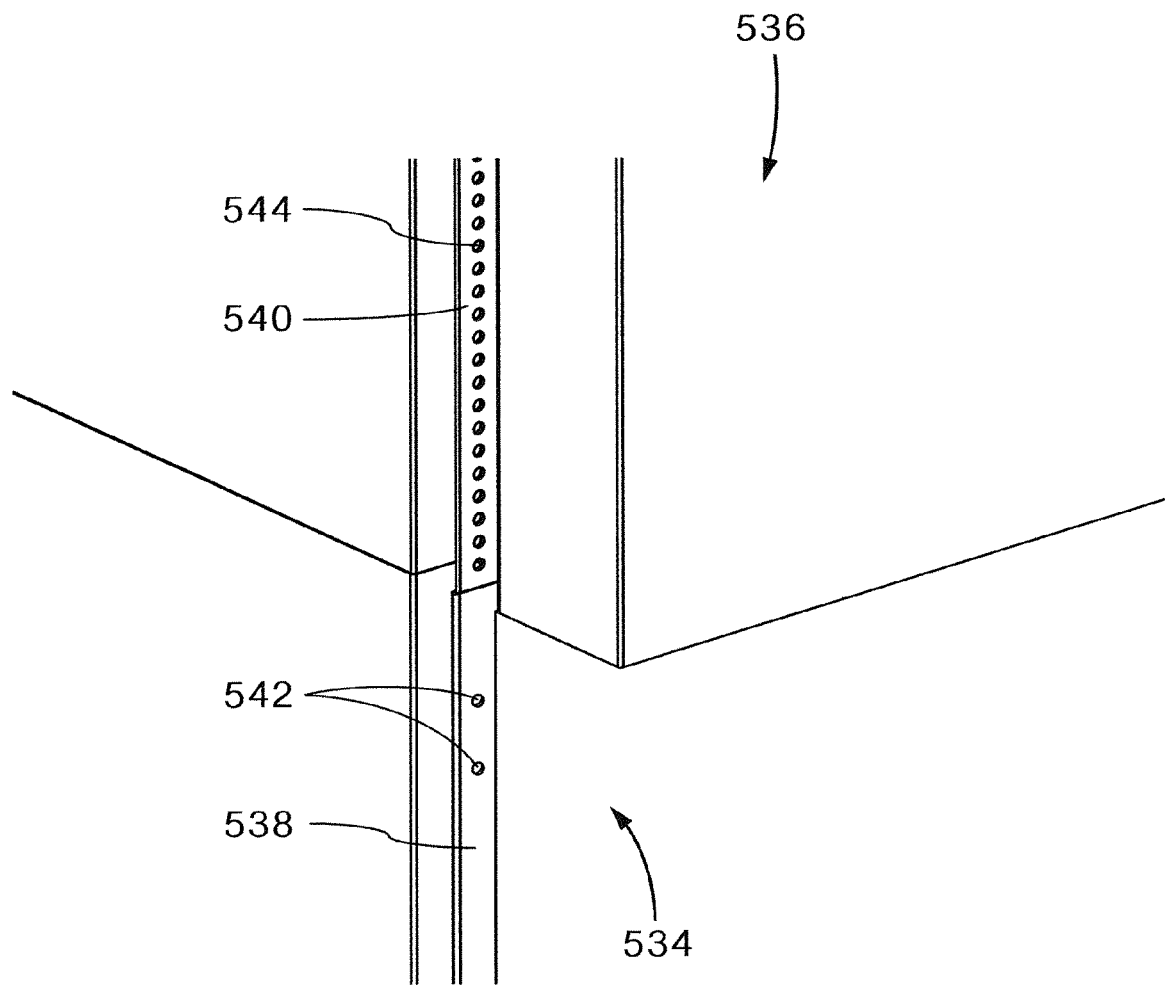
FIG. 31 is a detailed view of one of the locking systems of the adjustable vertical exhaust duct of FIG. 28, wherein four identical locking systems secure a lower duct section to an upper duct section.

As shown in FIG. 31, lower duct section 534 includes mating loop flange 538 having two apertures 542. Upper duct section 536 includes mating loop flange 540 having a plurality of apertures 544. Preferably, apertures 542 are the same size as apertures 544. One of apertures 542 is aligned with one of apertures 544 and a fastener, such as a screw, bolt or clevis, secures lower duct section 534 to upper duct section 536.

In operation, an installer begins with exhaust duct 530 in its lowest position. The installer raises upper duct section 536 up to the exhaust air plenum, aligns one of apertures 542 with one of apertures 544 and installs the fastener to secure upper duct section 536 in place. After installation, exhaust duct 530 may be in a partially extended position or the fully extended position shown in FIGS. 28 and 29.

Figure 32:
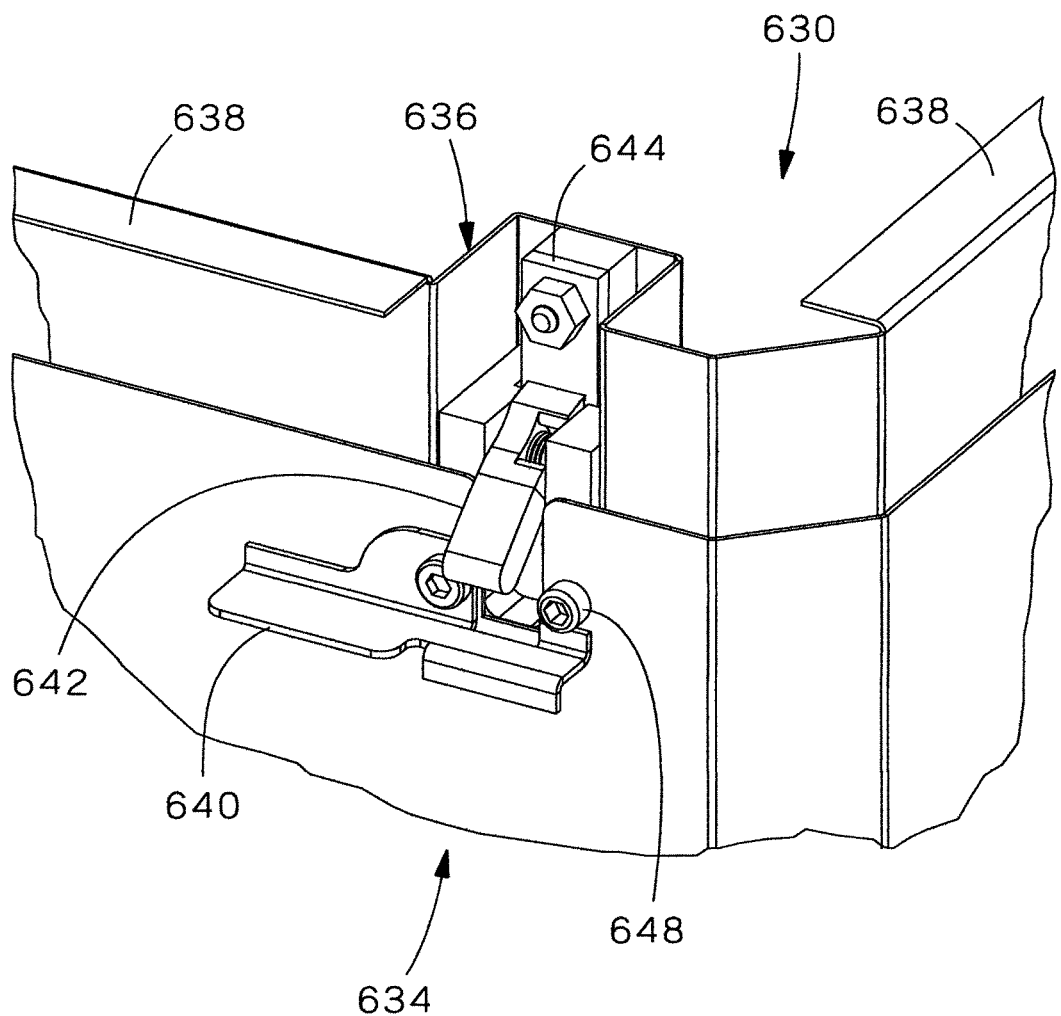
FIG. 32 is a detailed view of one of the lockout systems of an adjustable vertical exhaust duct in accordance with another embodiment of the present invention, wherein a pawl lockout is in a disengaged position with a pawl.
Figure 33:
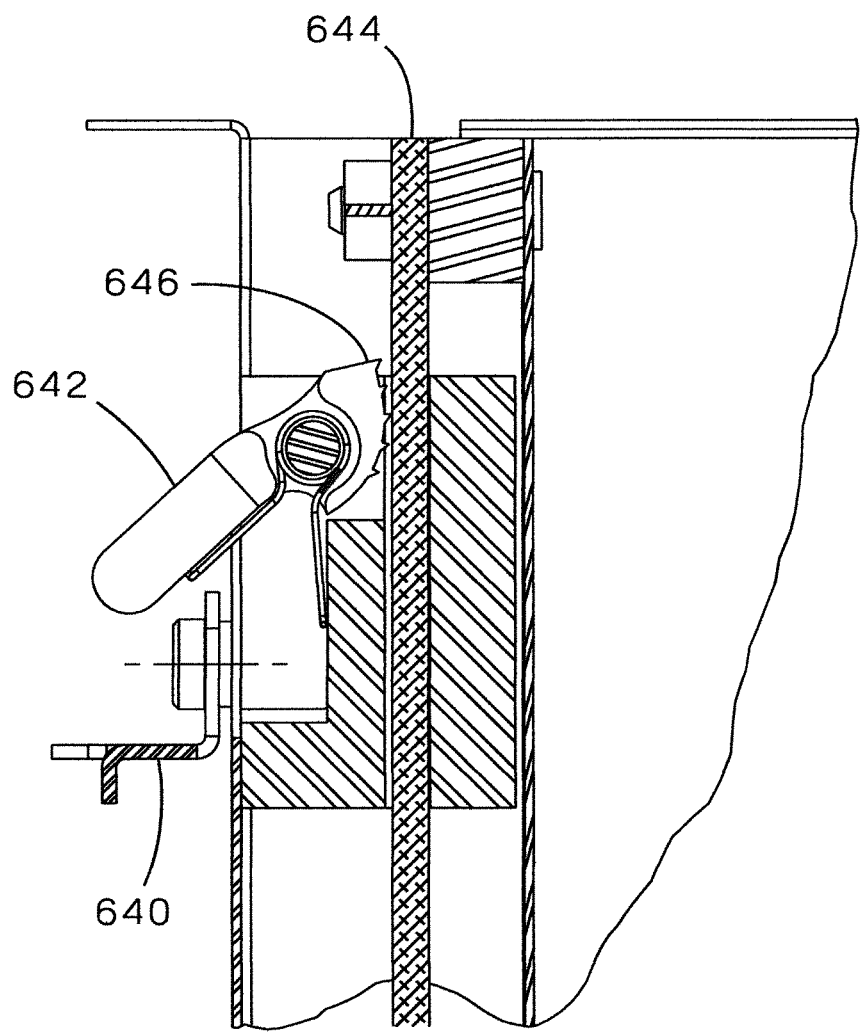
FIG. 33 is a cross-sectional view of the lockout system of FIG. 32.
Figure 34:
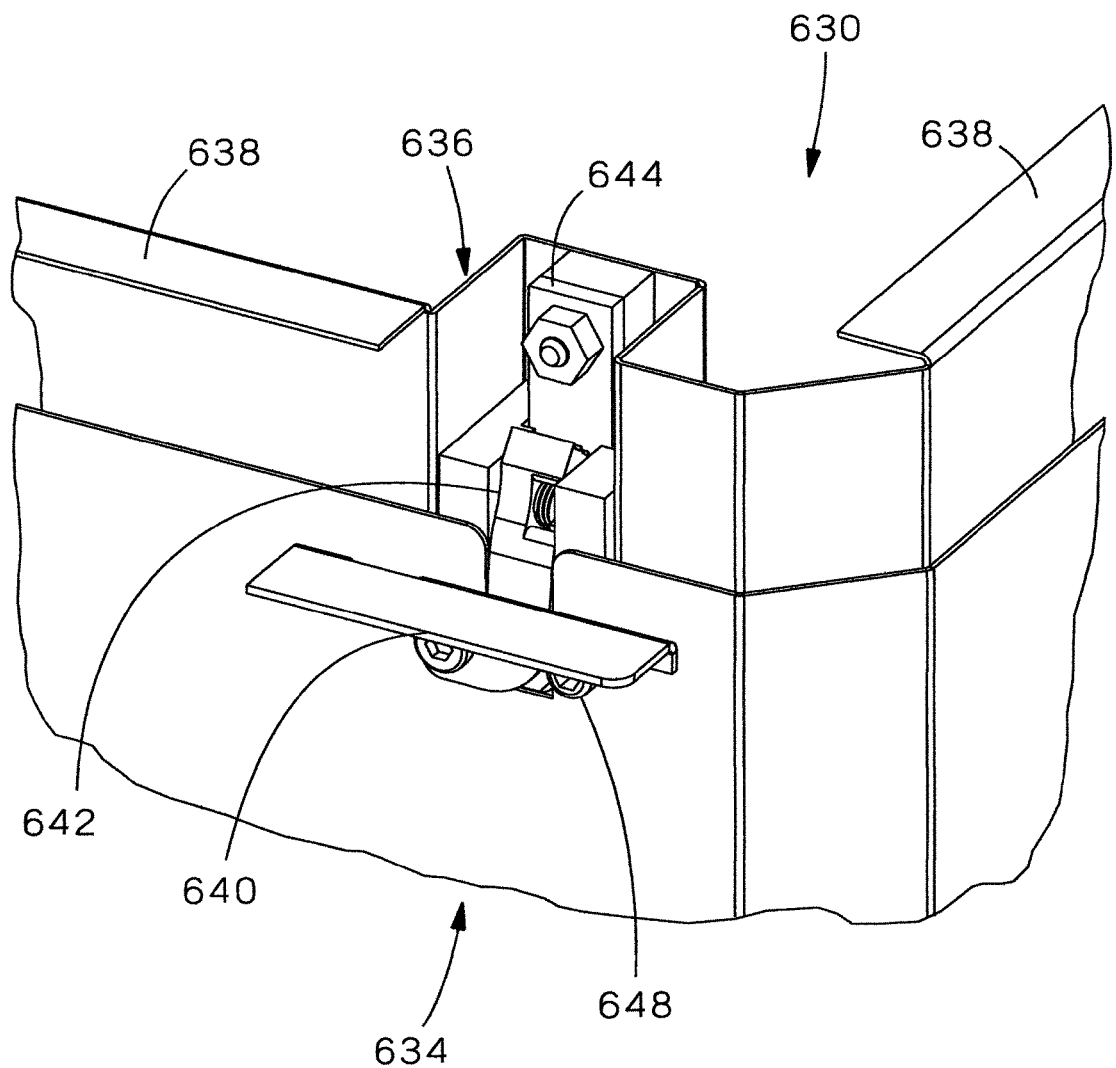
FIG. 34 is a detailed view of one of the lockout systems of the adjustable vertical exhaust duct of FIG. 32, wherein the pawl lockout is engaged with the pawl.

FIGS. 32-35 illustrate an adjustable vertical exhaust duct 630 which is mounted on a server cabinet in a data center room. Exhaust duct 630 will channel the hot air from the server cabinet into the exhaust air plenum of the data center room. The server cabinets and the exhaust air plenums come in different heights, potentially leaving a gap between the top of the server cabinets and the plenums. Exhaust duct 630 can accommodate these varying heights. As best seen in FIGS. 32 and 34, upper duct section 636 has top flanges 638 that may include a foam gasket that will press against the exhaust air plenum to ensure that hot air is evacuated from the server cabinet and channeled into the exhaust air plenum.

Exhaust duct 630 includes lower duct section 634 and upper duct section 636. Preferably, lower duct section 634 is larger than upper duct section 636. Exhaust duct 630 is similar to exhaust duct 130 shown in FIGS. 7-12, except exhaust duct 630 has pawl lockout 640. Pawl lockout 640 allows installers to lockout pawl 642 from engaging adjustment bar 644, freeing upper duct section 636 so it can be lowered. By deactivating pawl lockout 640, pawl 642 will automatically engage adjustment bar 644 and lock the location of exhaust duct 630. Preferably, pawl 642 is steel and adjustment bar 644 is aluminum.

In operation, an installer begins with exhaust duct 630 in its lowest position. The installer raises upper duct section 636 up to the exhaust air plenum, and upper duct section 636 is locked in place against the exhaust air plenum. FIG. 32 shows pawl lockout 640 in the disengaged position, allowing pawl 642 to engage adjustment bar 644 and lock exhaust duct 630 in place. As shown in FIG. 33, pawl 642 is spring-loaded against adjustment bar 644 and teeth 646 bite into adjustment bar 644. In the disengaged position, pawl lockout 640 is positioned below stop screw 648 (see FIG. 32).

Figure 35:
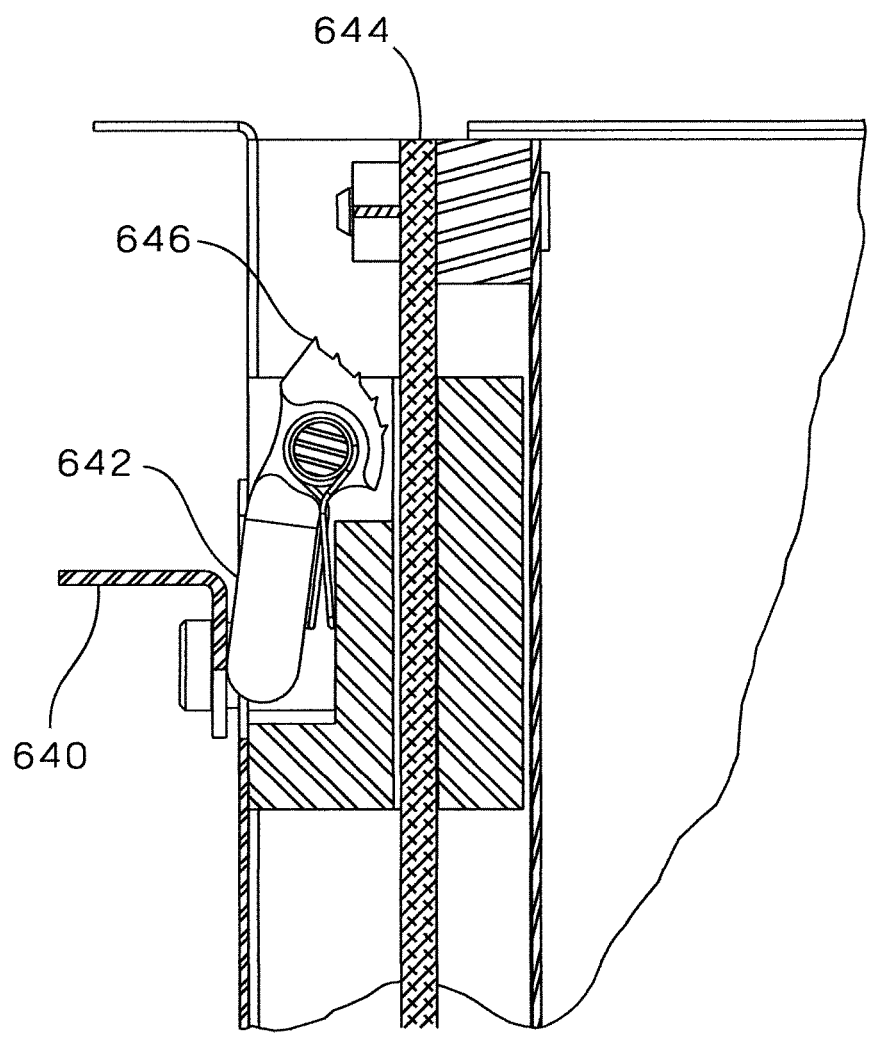
FIG. 35 is a cross-sectional view of the lockout system of FIG. 34, wherein the lockout system is engaged and the pawl is disengaged.

After installation, exhaust duct 630 may be in a partially extended position or a fully extended position. To release and lower upper duct section 636, the installer rotates pawl lockout 640 one hundred eighty degrees from its position in FIG. 32 to lockout pawl 642 from engaging adjustment bar 644 (FIG. 35). As shown in FIG. 34, pawl lockout 640 is engaged with pawl 642, freeing upper duct section 636 so it can be lowered. In the engaged position, pawl lockout 640 is positioned above stop screw 648.

While the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

The invention claimed is:

1. A vertical exhaust duct for an electronic equipment enclosure, the vertical exhaust duct comprising:
   an inner duct section and an outer duct section,
   wherein the inner duct section nests within the outer duct section and telescopes to adjust a height of the vertical exhaust duct,
   wherein the outer duct section includes at least one spring-loaded pawl for securing the vertical exhaust duct at a desired height,
   wherein the spring-loaded pawl allows the inner duct section to expand and prevents the inner duct from retracting,
   wherein the inner duct section includes a channel and a bar disposed in the channel,
   wherein the bar is deformable such that the spring-loaded pawl deforms the bar to secure the vertical exhaust duct at the desired height,
   wherein the inner duct section includes a top flange,
   wherein the top flange includes a seal.

2. The vertical exhaust duct of claim 1, wherein the spring-loaded pawl engages the inner duct section.

3. The vertical exhaust duct of claim 2, wherein the outer duct section includes a spring-loaded pawl lockout for disengaging the spring-loaded pawl from the inner duct section.

4. The vertical exhaust duct of claim 1, wherein the spring-loaded pawl is steel and the bar is aluminum.

5. The vertical exhaust duct of claim 1, further comprising a base for securing the outer duct section to the electronic equipment enclosure.

* * * * *